(12) United States Patent
Fu et al.

(10) Patent No.: US 8,293,354 B2
(45) Date of Patent: Oct. 23, 2012

(54) UV CURABLE SILSESQUIOXANE RESINS FOR NANOPRINT LITHOGRAPHY

(75) Inventors: Peng-Fei Fu, Midland, MI (US); Lingjie Jay Guo, Ann Arbor, MI (US)

(73) Assignee: The Regents of The University of Michigan, Ann Arbor, MI (US)

(*) Notice: Subject to any disclaimer, the term of this patent is extended or adjusted under 35 U.S.C. 154(b) by 297 days.

(21) Appl. No.: 12/421,333

(22) Filed: Apr. 9, 2009

(65) Prior Publication Data

US 2009/0256287 A1   Oct. 15, 2009

Related U.S. Application Data

(60) Provisional application No. 61/043,519, filed on Apr. 9, 2008.

(51) Int. Cl.
  B32B 3/30  (2006.01)
  B32B 9/04  (2006.01)

(52) U.S. Cl. ........ 428/141; 428/156; 428/167; 428/172; 428/332; 428/339; 428/447; 528/32; 528/38; 528/42

(58) Field of Classification Search .................. None
See application file for complete search history.

(56) References Cited

U.S. PATENT DOCUMENTS

| | | | |
|---|---|---|---|
| 6,558,804 B2* | 5/2003 | Sato et al. ...................... | 428/447 |
| 6,860,956 B2 | 3/2005 | Bao et al. | |
| 7,344,847 B2 | 3/2008 | Hunt et al. | |
| 7,374,864 B2 | 5/2008 | Guo et al. | |
| 7,385,021 B2* | 6/2008 | Hamada et al. ................ | 528/12 |
| 7,417,104 B2* | 8/2008 | Iwabuchi et al. .............. | 528/21 |
| 7,625,687 B2* | 12/2009 | Hu et al. ..................... | 430/270.1 |
| 7,642,043 B2* | 1/2010 | Ogihara et al. .............. | 430/331 |
| 7,648,767 B2 | 1/2010 | Fu et al. | |
| 2004/0231781 A1 | 11/2004 | Bao et al. | |
| 2005/0244658 A1* | 11/2005 | Bae et al. ...................... | 428/447 |
| 2006/0194252 A1 | 8/2006 | Hunt et al. | |
| 2006/0237881 A1 | 10/2006 | Guo et al. | |
| 2007/0059497 A1 | 3/2007 | Huang et al. | |

(Continued)

FOREIGN PATENT DOCUMENTS

JP  2005-321667  * 11/2005

(Continued)

OTHER PUBLICATIONS

Abstract of JP 2005-321667.*

(Continued)

*Primary Examiner* — Marc Zimmer
(74) *Attorney, Agent, or Firm* — Harness, Dickey & Pierce, P.L.C.

(57) ABSTRACT

Radiation-curable silsesquioxane resin materials are employed for micro- and nanolithography. The resin materials can include a radiation-curable silsesquioxane resin and a photo-initiator having low viscosity. The low viscosity of the liquid system allows imprinting with low pressure and low temperature; e.g. room temperature. The resist's dry etching resistance is increased and the cured film is more easily separated from the mask. Due to its high modulus after cure, the material allows the fabrication of micro- and nano-features having high aspect ratios while providing a high throughput. Various pattern sizes, for example, ranging from tens of microns to as small as a few nanometers, may be achieved with the UV-curable material system.

18 Claims, 32 Drawing Sheets

U.S. PATENT DOCUMENTS

| | | | |
|---|---|---|---|
| 2007/0122749 A1* | 5/2007 | Fu et al. | 430/311 |
| 2007/0196589 A1 | 8/2007 | Fu et al. | |
| 2008/0318436 A1 | 12/2008 | Fu et al. | |
| 2009/0046362 A1 | 2/2009 | Guo et al. | |
| 2009/0202788 A1 | 8/2009 | Fu et al. | |
| 2010/0298169 A1* | 11/2010 | Wessels et al. | 506/18 |

FOREIGN PATENT DOCUMENTS

| | | |
|---|---|---|
| WO | WO 2007/094848 | 8/2007 |
| WO | WO 2008/124180 | 10/2008 |

OTHER PUBLICATIONS

Machine-generated translation of JP 2005-321667.*

Written translation of select passages of JP 2005-321667 provided by USPTO translator.*

"Fluorinated Organic-Inorganic Hybrid Mold as a New Stamp for Nanoimprint and Soft Lithography" authored by Choi et al. and published in Langmuir (2005) 21, 9390-9392.*

"Stamp Replication for Thermal and UV Nanoimprint Lithography using a UV-sensitive Silsesquioxane Resist" authored by Kehagias et al. and published in Microelectronic Engineering (2009) 776-778.*

Abstract for and machine-generated translation into English of JP 2006-285017 (Oct. 2006).*

Abstract for JP 62-211641 (Sep. 1987).*

Crivello, J. V., "The Discovery and Development of Onium Salt Cationic Photoinitiators," J. Polym. Sci. Part A: Polym. Chem., vol. 37, pp. 4241-4254 (1999).

Hernandez, C. P. et al., "Easy duplication of stamps using UV-cured fluoro-silsesquioxane for nanoimprint lithography," J. Vac. Sci & Technol., vol. B 26, No. 26, pp. 2426-2429 (Nov./Dec. 2008).

Hernandez, C. P. et al., "High Throughput and Etch-Selective Nanoimprinting and Stamping Based on Fast-Thermal-Curing Poly(dimethysiloxanes)," Adv. Mater., vol. 19, pp. 1222-1227 (2007).

* cited by examiner (a) $T^{Ph}T^{MA}$ (b) $T^{Ph}T^{MA}T^{Fluo}$ (c) $T^{Ph}T^{Ep}$ (d) $T^{Ph}T^{Ep}T^{Fluo}$

Residual layer removal

☐ CHF3, 2min, 150W, 20scc,

Metal Deposition

Metal: Cr
Thickness: 100nm

UV CURABLE SILSESQUIOXANE RESINS FOR NANOPRINT LITHOGRAPHY

CROSS-REFERENCE TO RELATED APPLICATIONS

This application claims the benefit of U.S. Provisional Application No. 61/043,519, filed on Apr. 9, 2008, the disclosure of which is incorporated by reference.

GOVERNMENT RIGHTS

This invention was made with government support under Grant No. ECS 0424204 awarded by the National Science Foundation. The government has certain rights in the invention.

FIELD

The present disclosure relates to the fabrication of micro- and nano-structures, including fabrication of such structures by low-pressure lithographic printing using UV-curable resins.

INTRODUCTION

Nano-patterning is an aspect of nanotechnology used to fabricate nanostructures. However, in order for nano-devices and nanostructure fabrication to have practical significance, low-cost and high-throughput nano-patterning techniques are necessary. Among emerging techniques, nanoimprint lithography (NIL) is regarded as one of the most promising. NIL has the capability to pattern sub-10 nm structures, yet entails relatively straightforward equipment and processing. NIL has been successfully used in fabrication of electrical and optical devices and wafer-scale processing has been achieved. For example, nanoimprinting by means of thermal embossing is one approach, employing an apparatus that can apply pressure and provide heat.

Thermoplastic polymeric materials can be used as nanoimprinting resists. However, viscosities of many polymers heated above their glass transition temperatures ($T_g$) are still quite high, and imprinting can require high pressure and long imprinting times (e.g., from 10 min to over 1 hr), which considerably affects throughput. Such high imprinting temperatures can also induce undesirable thermal stresses into the replicated nanostructures. In addition, long time periods can be required to both heat the resist above its $T_g$ and to completely fill the mold cavities with the highly viscous polymer. High pressure may also be necessary to force the molten polymer into the mold. Finally, heat and pressure cycles can easily damage the mold, including for example molds made of $SiO_2$, thereby adding to the overall cost and throughput time.

A substitute for thermoplastic polymers includes thermoset polymers formed from thermally curable liquids. Such liquid thermoset polymers can be imprinted under moderate temperatures and low pressures. For example, several thermally curable materials are used as resists for NIL, such as those described in C. P.-Hernandez, J.-S. Kim, L. J. Guo, and P.-F. Fu, "High throughput and etch selective nanoimprinting and stamping based on fast thermal-curable polydimethysiloxanes," *Adv. Mater.* 19, 1222-1227, 2007. However, for achieving the high-throughput required in real industrial operations and high volume production, an imprinting process without thermal cycles would be preferable.

Step-and-Flash Imprint Lithography (S-FIL) is a technique using a UV-curable liquid material based on free radical polymerization of acrylic functional monomers and oligomers. The liquid resist is dispensed in droplet form onto the substrate and the template is brought into contact with the substrate and pressed to spread out the liquid resist. Next, the liquid resist is cured by UV light exposure. One advantage is that this process can be carried out at room temperature; however, in many applications simple spin-coating methods are preferred that allow much higher process throughput. In addition, UV curing formulations used in S-FIL are based on free radical polymerization of acrylic monomers. Such acrylic materials typically exhibit shrinkage following cure and may also suffer from oxygen sensitivity, where oxygen scavenges the free radical species during cure, inhibiting the polymerization process at the resist surface and making the process prone to defect generation. What is more, in order to provide the low viscosity required for low pressure imprinting, reactive monomers are usually needed. Such monomers are typically volatile, which presents emissions-related issues, including a very unpleasant odor.

A need, therefore, exists for improved compositions and methods for nanoimprint lithography.

SUMMARY

The present technology provides compositions, methods, and systems that include resins that are radiation-curable, where radiation includes thermal radiation and actinic radiation, such as UV-radiation, where the resins are useful for nanoimprint lithography (NIL). Radiation-curable groups are reactive following exposure to thermal radiation and/or actinic radiation, where actinic radiation includes electromagnetic radiation, electron beams, and UV light. These UV-curable resins include radiation-curable silsesquioxane (SSQ) resins that may be used as the imprint resist for micro- and nanoimprinting lithography. For example, the present disclosure provides polymerization of radiation-curable siloxanes, alkylsiloxanes, arylsiloxanes, and/or fluorosiloxanes at room temperature and low pressure to provide cured silsesquioxane resist layers.

The present compositions may comprise a silsesquioxane resin, wherein the silsesquioxane resin comprises at least one radiation-curable group. The composition may further include one or more photoacid generators and/or solvents.

In some embodiments, the silsequioxane resin includes at least one unit selected from each of formulas (I) —($R^1SiO_x$)— and (II) —($R^2SiO_x$)—. In these instances, $R^1$ may be independently selected from the group consisting of hydrogen; alkyl groups having one to twelve carbons (C1-C12) that are linear or branched; C1-C12 linear or branched alkyl groups including at least one heteroatom selected from the group consisting of nitrogen, oxygen, halogen, and combinations thereof; and C6-C12 aryl groups, including phenyl groups. In some embodiments, the halogen is fluorine. $R^2$ may be a radiation-curable group independently selected from the group consisting of acrylate, epoxy, and vinyl ether groups. The subscript "x" in each instance is from about 1 to about 1.5.

In some embodiments, the silsequioxane resin comprises at least one di-functional (D) unit of formula (III) —($R^3R^4SiO$)— derived from a difunctional silane, $R^3R^4SiX_2$, wherein X is a halide, alkoxyl, or acetoxy group: (III) —($R^3R^4SiO$)—. In this case, $R^3$ and $R^4$ are independently selected from the group consisting of hydrogen; C1-C12 linear or branched alkyl groups; C1-C12 linear or branched alkyl groups including at least one heteroatom selected from the group consisting of nitrogen, oxygen, halogen, and combinations thereof; C1-C12 linear or branched carboxylate groups; C1-C12 linear or branched ether groups; C6-C12 aryl groups, including phenyl groups; and fluoro-containing organic groups, including fluoro-alkyl groups and fluoro-ether groups; and a radiation-curable group selected from the group consisting of acrylate, epoxy, and vinyl ether groups.

In some embodiments, the silsesquioxane resin has a formula selected from the group consisting of formulas (III) $[R^1SiO_x]_m[R^2SiO_x]_n$ and (IV) $[R^1SiO_x]_m[R^2SiO_x]_n[R^3SiO_x]_o$. As per these formulas, $R^1$ is independently selected from the group consisting of hydrogen; C1-C12 linear or branched alkyl groups; C1-C12 linear or branched alkyl groups including at least one heteroatom selected from the group consisting of nitrogen, oxygen, halogen, and combinations thereof; and C6-C12 aryl groups, including phenyl groups. $R^2$ is a radiation-curable group independently selected from the group consisting of acrylate, epoxy, and vinyl ether groups. $R^3$ is independently selected from the group consisting of C1-C12 linear or branched alkyl groups including at least one halogen. Subscript "m" is the molar ratio of $[R^1SiO_x]$ and in certain aspects, is optionally about 20% to about 80%, "n" is the molar ratio of $[R^2SiO_x]$ and is optionally about 20% to about 80%, "o" is the molar ratio of $[R^3SiO_x]$ and is optionally about 2% to about 10%, and "x" is optionally about 1 to about 1.5, with the proviso that m+n in (III) or m+n+o in (IV) is about 100%.

In some embodiments, the silsesquioxane resin includes at least one unit selected from the group consisting of formula (V) $—(R^1SiO_x)—(R^2SiO_x)—$ and (VI) $—(R^1SiO_x)—(R^2SiO_x)—(R^3SiO_x)—$. $R^1$ is independently selected from the group consisting of hydrogen; C1-C12 linear or branched alkyl groups; C1-C12 linear or branched alkyl groups including at least one heteroatom selected from the group consisting of nitrogen, oxygen, halogen, and combinations thereof; carboxylate groups and ether groups; C6-C12 aryl groups, including phenyl groups; and fluoro-containing organic groups, including fluoro-alkyl groups and fluoro-ether groups. $R^2$ is a radiation-curable group independently selected from the group consisting of acrylate, epoxy, and vinyl ether groups. $R^3$ is independently selected from the group consisting of C1-C12 linear or branched alkyl groups including at least one fluorine. And x is about 1 to about 1.5.

In some embodiments, the silsesquioxane resin comprises one of the following formulas: $[R^1SiO_{3/2}]_m[R^2SiO_{3/2}]_n$ ($T^{R1}T^{R2}$, m+n=1); $[R^1SiO_{3/2}]_m[R^2SiO_{3/2}]_n[R^3R^4SiO]_p$ ($T^{R1}T^{R2}D^{R3,R4}$, m+n+p=1); $[R^1SiO_{3/2}]_m[R^2SiO_{3/2}]_n[R^3R^4SiO]_p[SiO_2]_q$ ($T^{R1}T^{R2}D^{R3,R4}Q$, m+n+p+q=1); $[R^1SiO_{3/2}]_m[R^2SiO_{3/2}]_n[SiO_2]_q$ ($T^{R1}T^{R2}Q$, m+n+q=1); and $[R^1SiO_{3/2}]_m[R^2SiO_{3/2}]_n[R^5SiO_{3/2}]_o$ ($T^{R1}T^{R2}T^{R5}$, m+n+o=1). The notation "T" refers to tri-functional groups, "D" refers to di-functional groups, and "Q" refers to quaternary-functional groups. $R^1$, $R^3$, and $R^4$ are independently selected from the group consisting of hydrogen; C1-C12 linear or branched alkyl groups; C1-C12 linear or branched alkyl groups including at least one heteroatom selected from the group consisting of nitrogen, oxygen, halogen, and combinations thereof; C1-C12 linear or branched carboxylate groups; C1-C12 linear or branched ether groups; C6-C12 aryl groups, including phenyl groups; and fluoro-containing organic groups, including fluoro-alkyl groups and fluoro-ether groups. $R^2$ is a radiation-curable group independently selected from the group consisting of acrylate, epoxy, and vinyl ether groups. $R^5$ is a fluoro-containing organic group, including fluoro-alkyl groups and fluoro-ether groups. The proportions of the formula components are defined as: m is the molar ratio of $[R^1SiO_{3/2}]$ unit, n is the molar ratio of $[R^2SiO_{3/2}]$ unit, p is the molar ratio of $[R^3R^4SiO]$ unit, q is the molar ratio of $[SiO_2]$ unit, and o is the molar ratio of $[R^5SiO]$ unit. In each case, the molar ratios of all components in each formula add up to 1. In some embodiments, the present disclosure provides a mold for nanoimprinting lithography where the mold includes a cured silsesquioxane resin on a substrate, the cured silsesquioxane resin comprising features having dimensions from about 2 nanometers to about 100 micrometers. The cured silsesquioxane resin may include fluoroalklyl groups and the substrate may be flexible.

The present methods of nanoimprint lithography include applying a liquid resist composition to a substrate, the composition comprising a silsesquioxane resin, wherein the silsesquioxane resin comprises at least one radiation-curable group. The resist is imprinted with a mold and cured. The mold and the cured resist are then separated. Curing the resist may include exposing the resist to radiation, such as thermal radiation (e.g., heat) and/or actinic radiation (e.g., electron beam or UV radiation). The mold used for imprinting may include features having dimensions anywhere from about 2 nanometers to about 100 micrometers.

In some embodiments, the method uses a substrate that includes a coating that is soluble in a solvent, where the liquid resist composition is applied onto the coating. The method may further include removing residual resist to expose a portion of the underlying coating after imprinting and curing. After removing the residual resist, the exposed portion of the underlying coating may be etched, thereby exposing a portion of the substrate, and undercutting a portion of the resist. A material, such as a metal, may then be deposited onto the exposed portion of the substrate and the remaining resist and coating may be lifted-off by solubilizing the coating with solvent, leaving the substrate and deposited material.

DRAWINGS

The drawings described herein are for illustrative purposes only of selected embodiments and not all possible implementations, and are not intended to limit the scope of the present disclosure.

Figure 8:
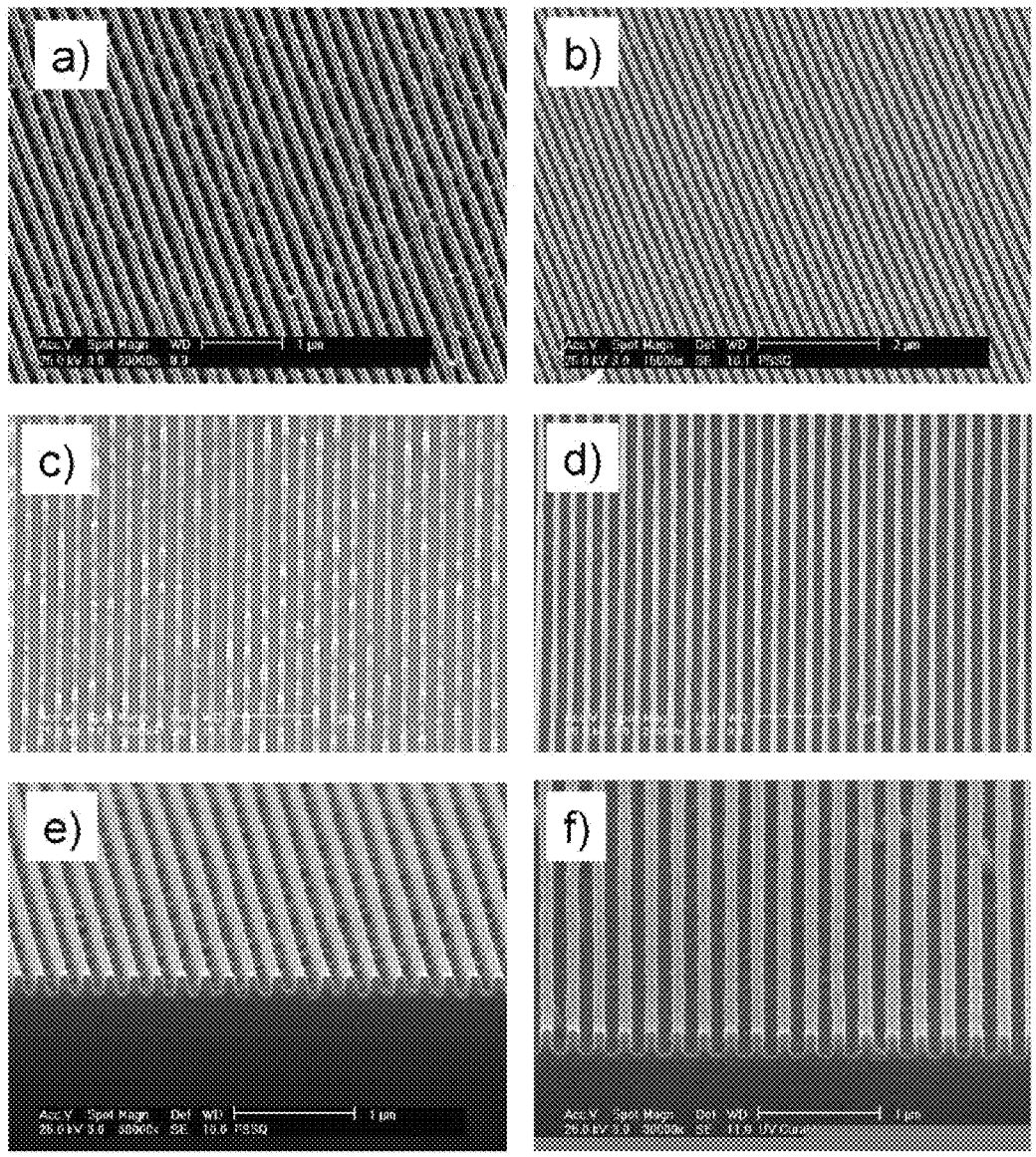
Figure 9:
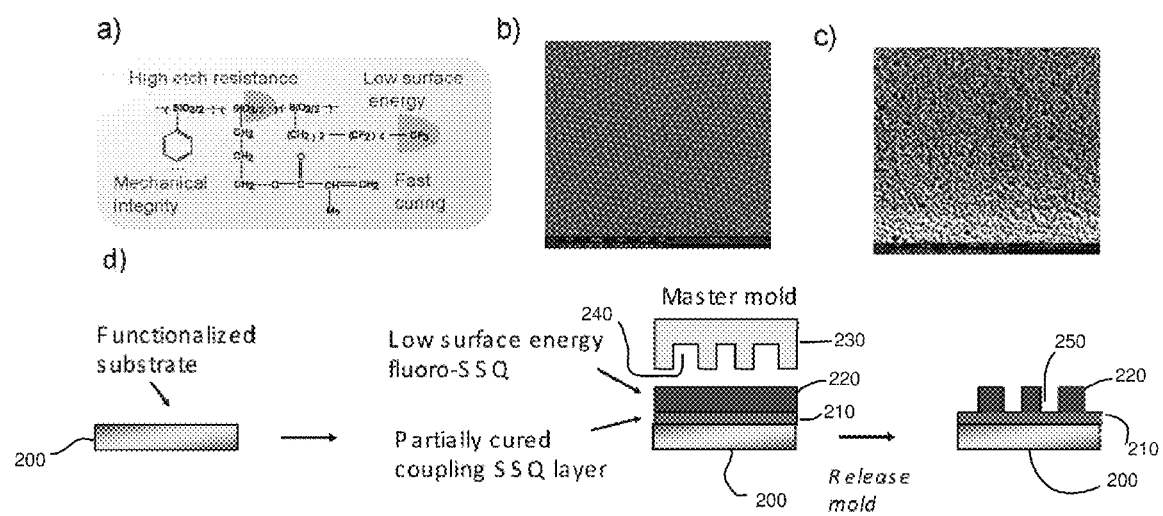
Figure 10:
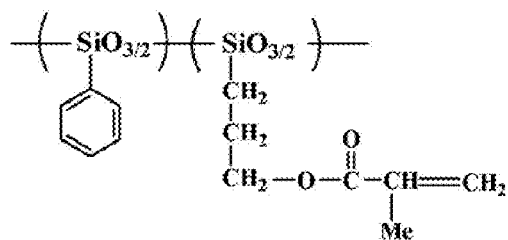
Figure 10:
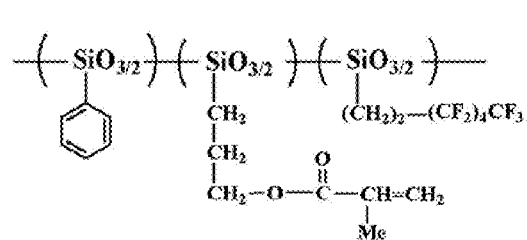
Figure 10:
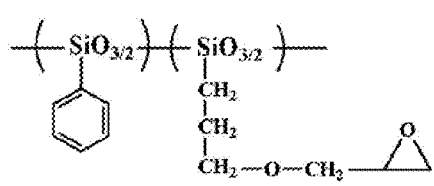
Figure 10:
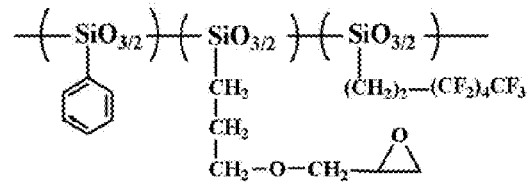
Figure 11:
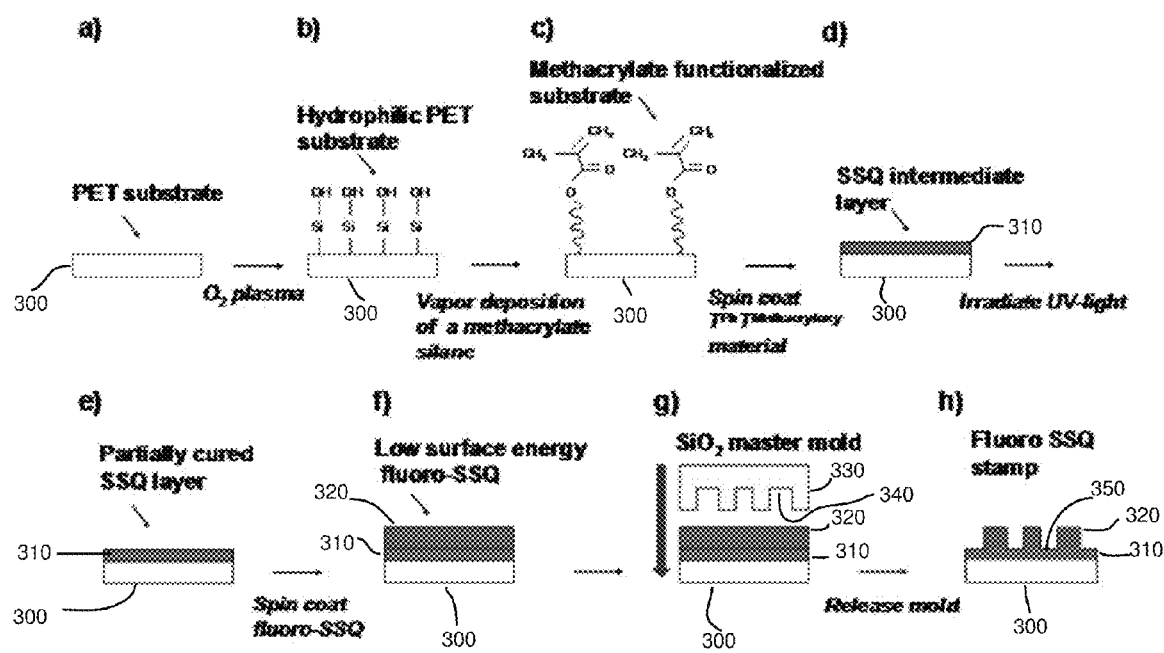
Figure 12:
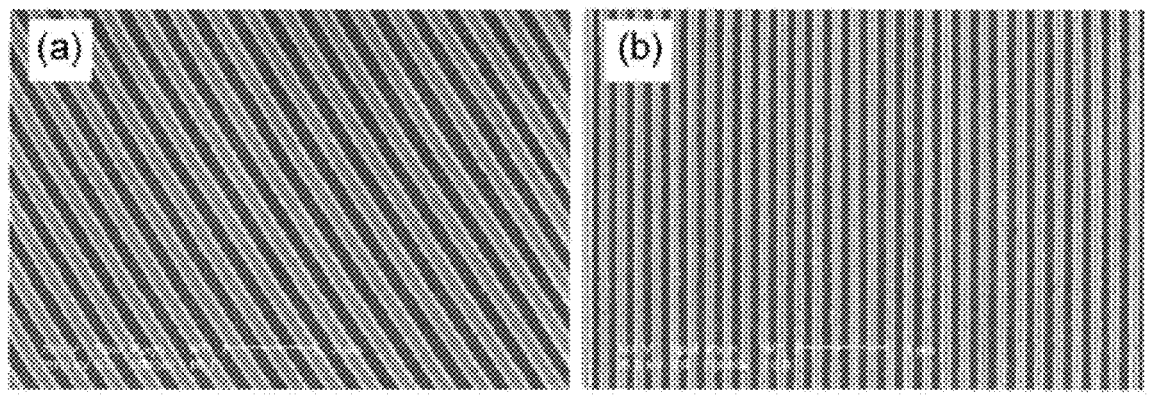
Figure 13:
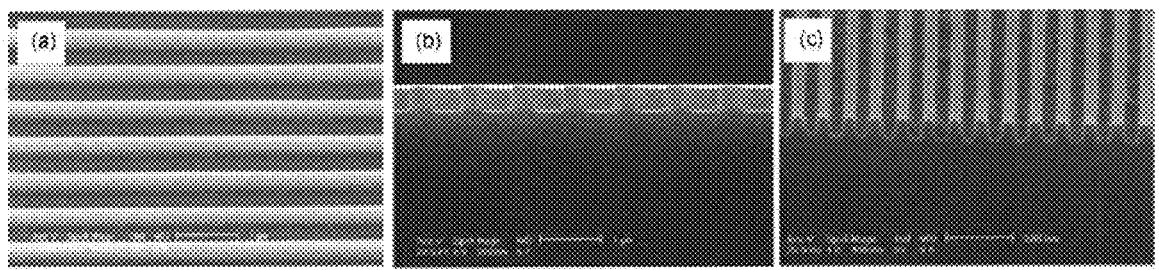
Figure 14:
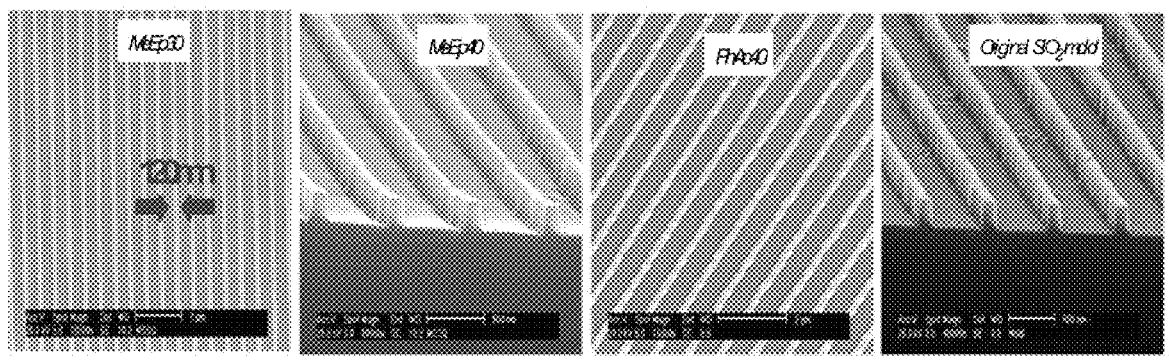
Figure 15:
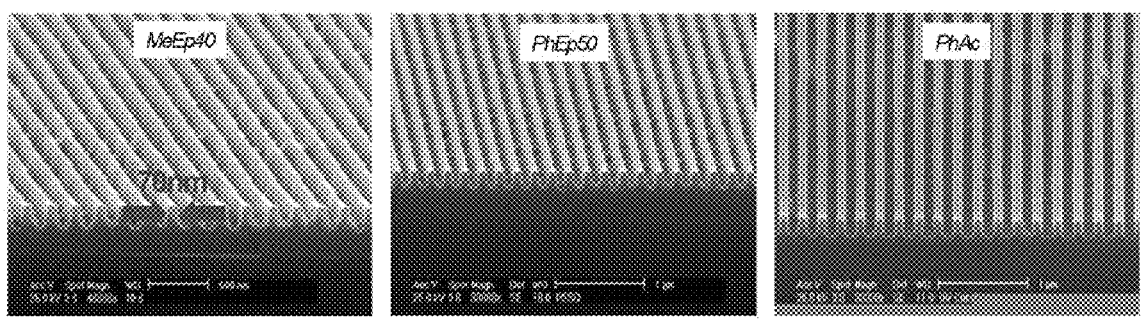
Figure 16:
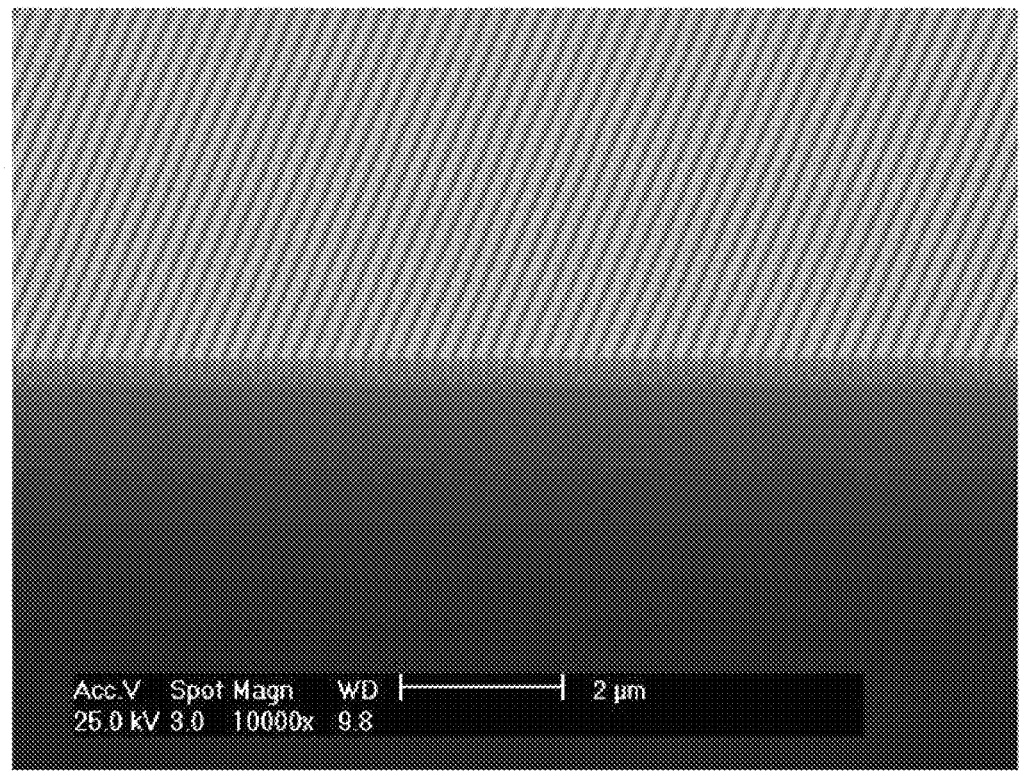
Figure 16:
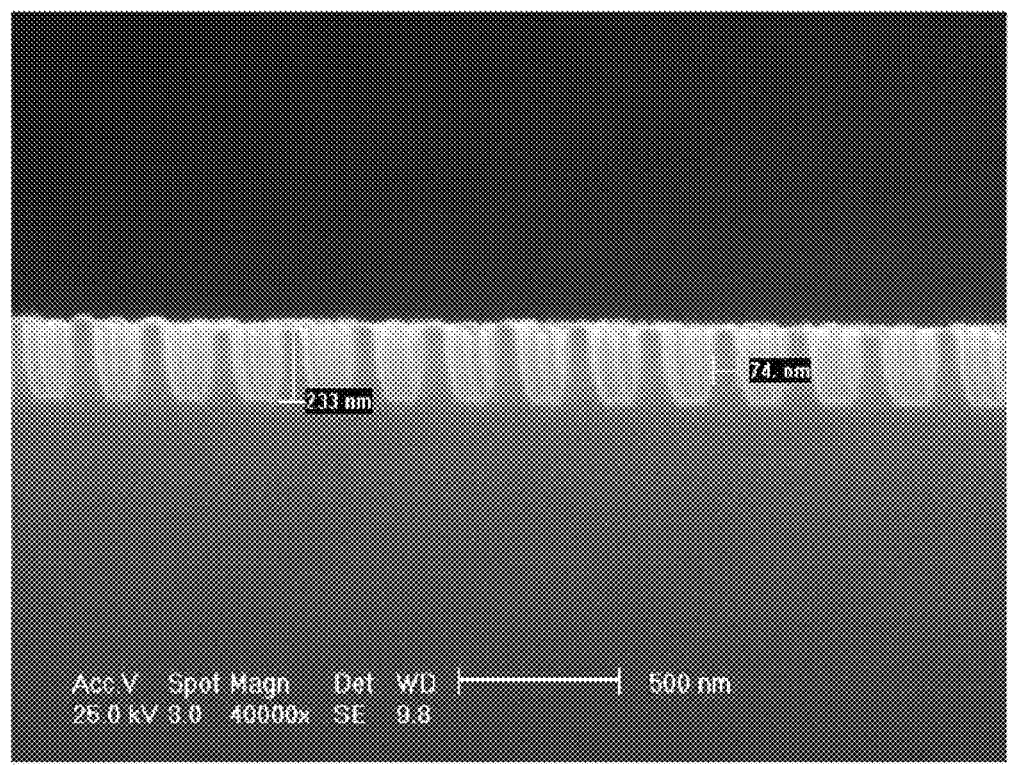
Figure 17:
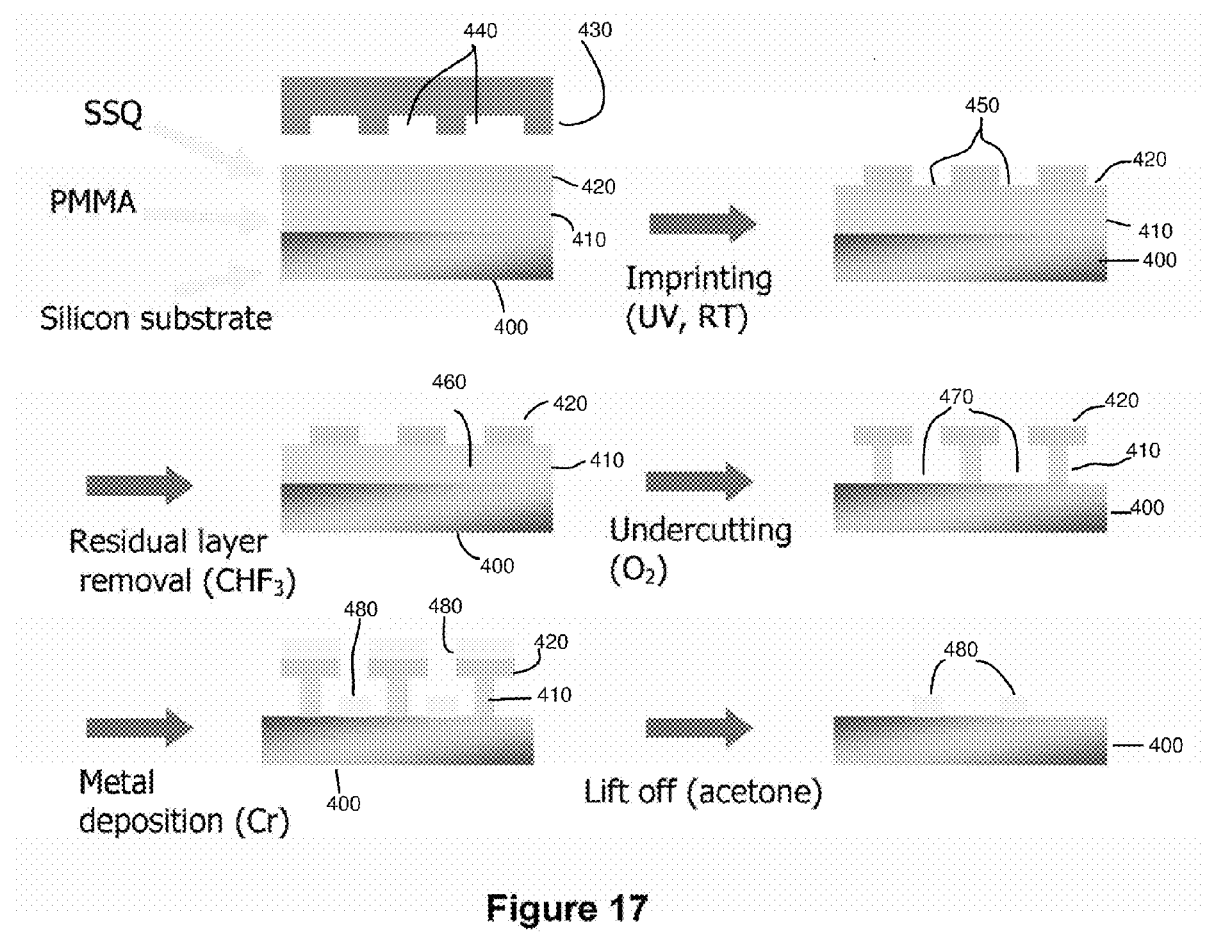
Figure 18:
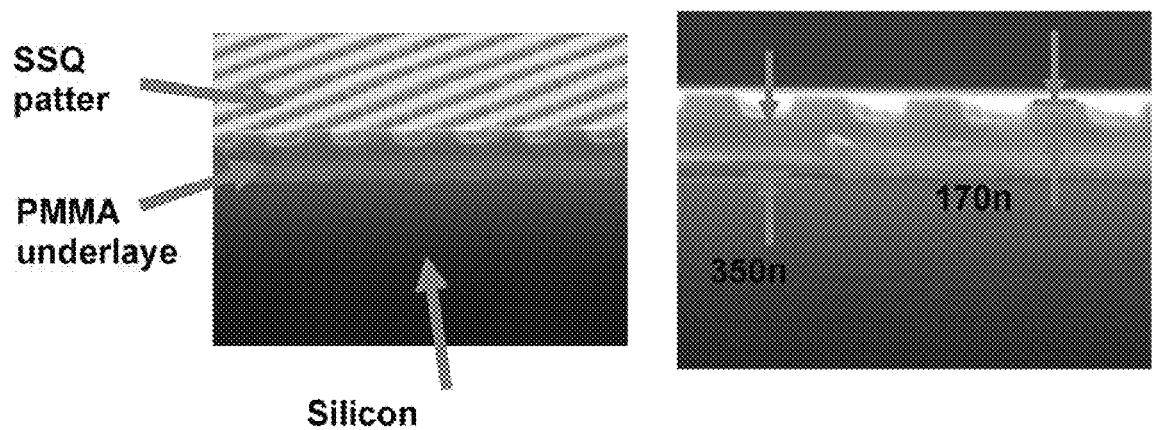
Figure 19:
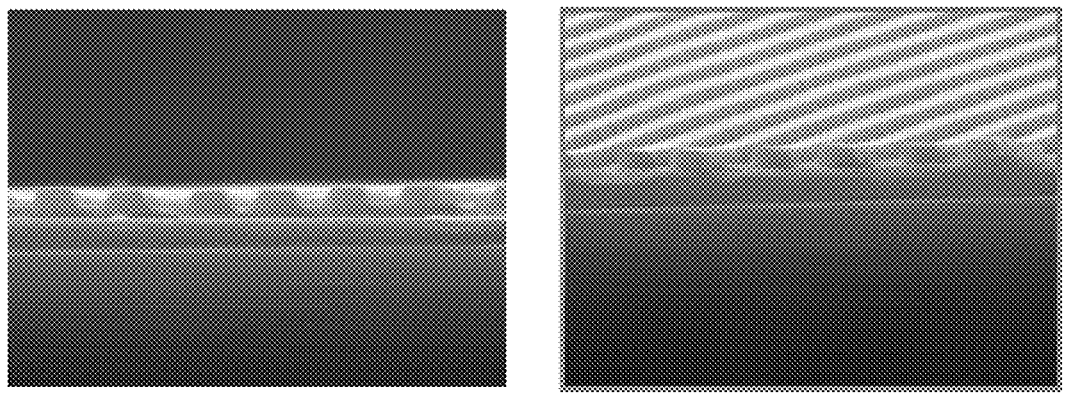
Figure 20:
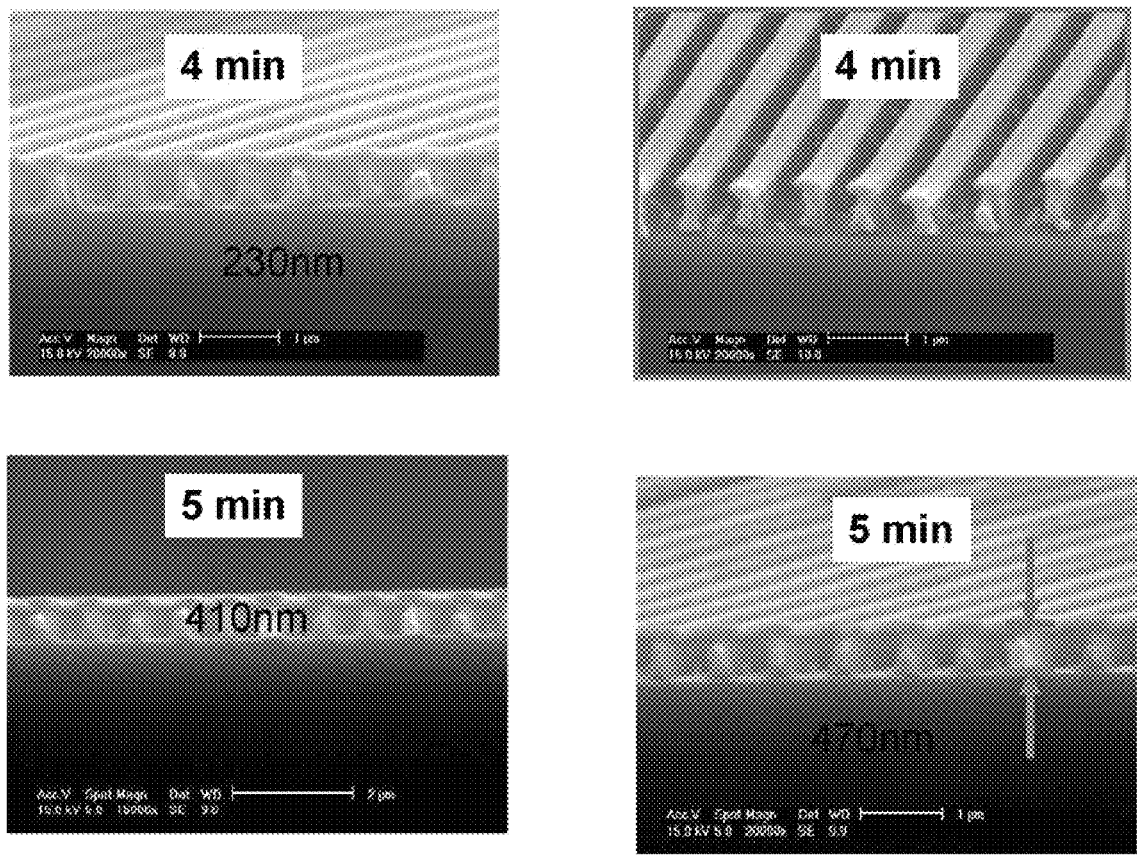
Figure 21:
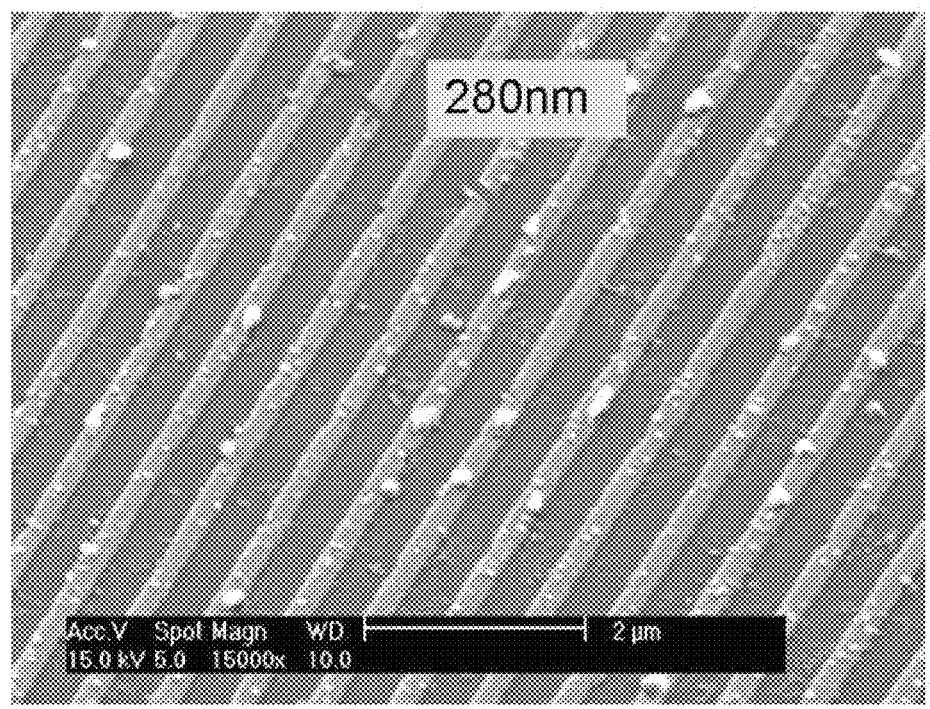
Figure 22:
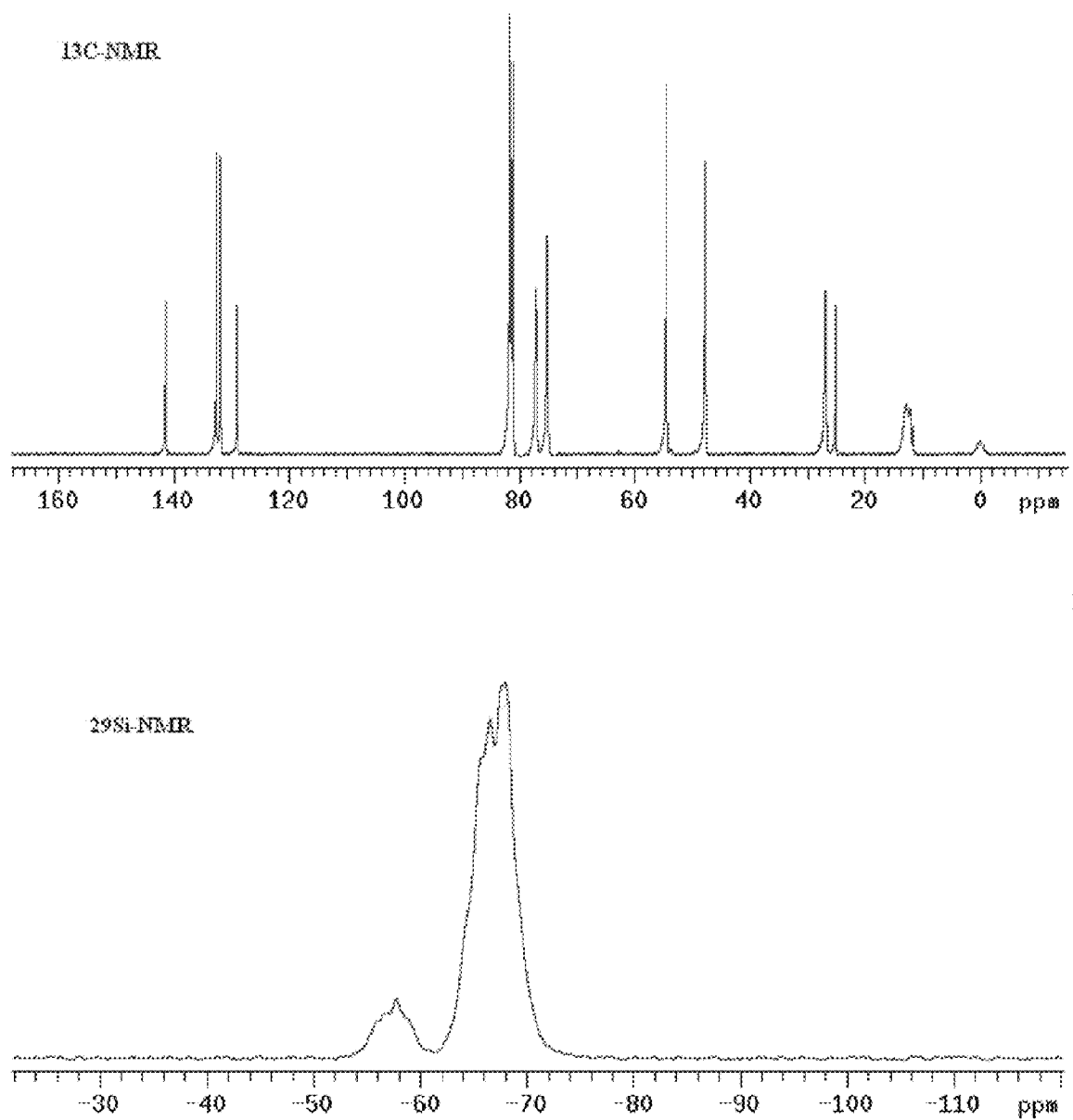
Figure 23:
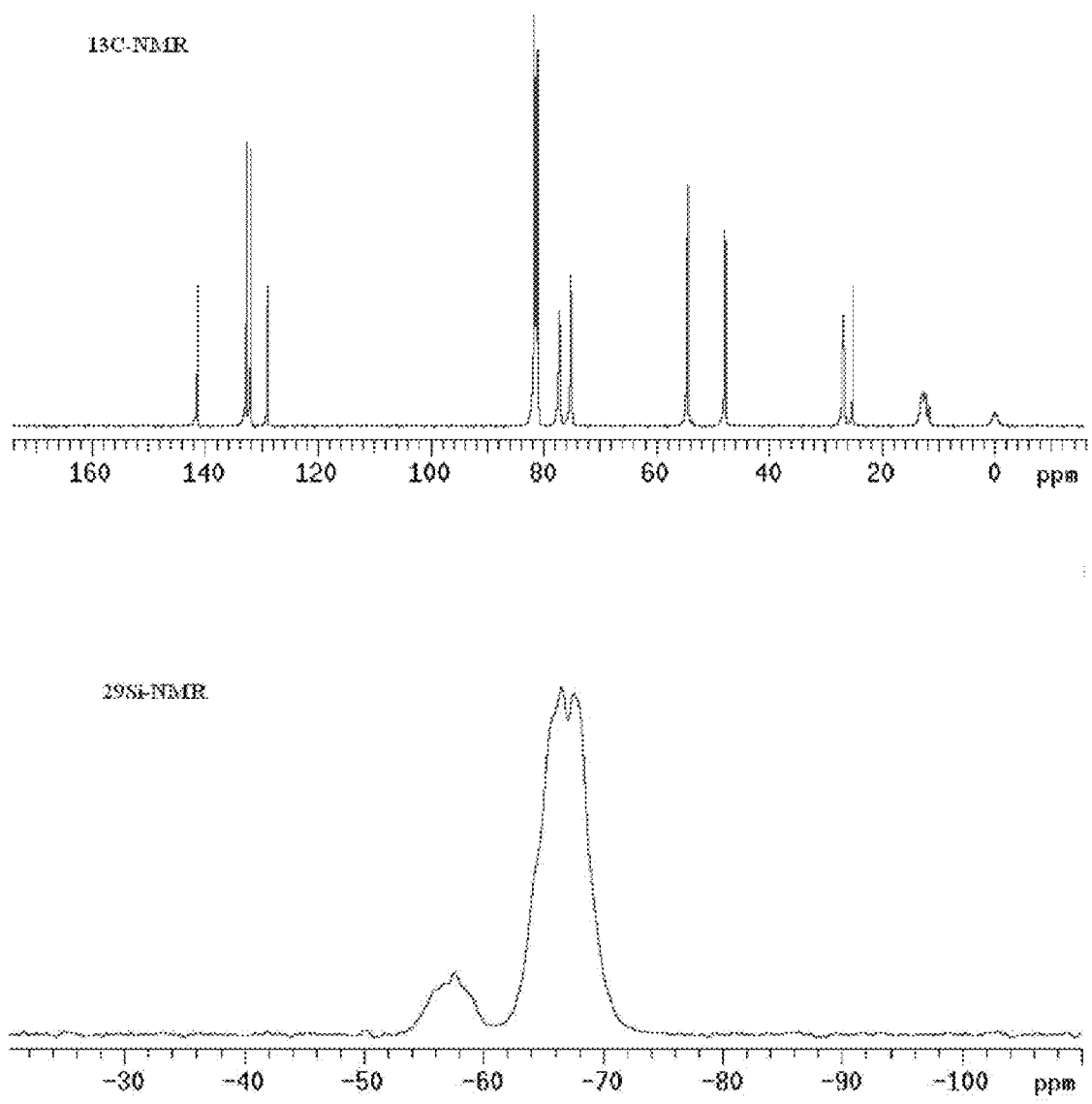
Figure 24:
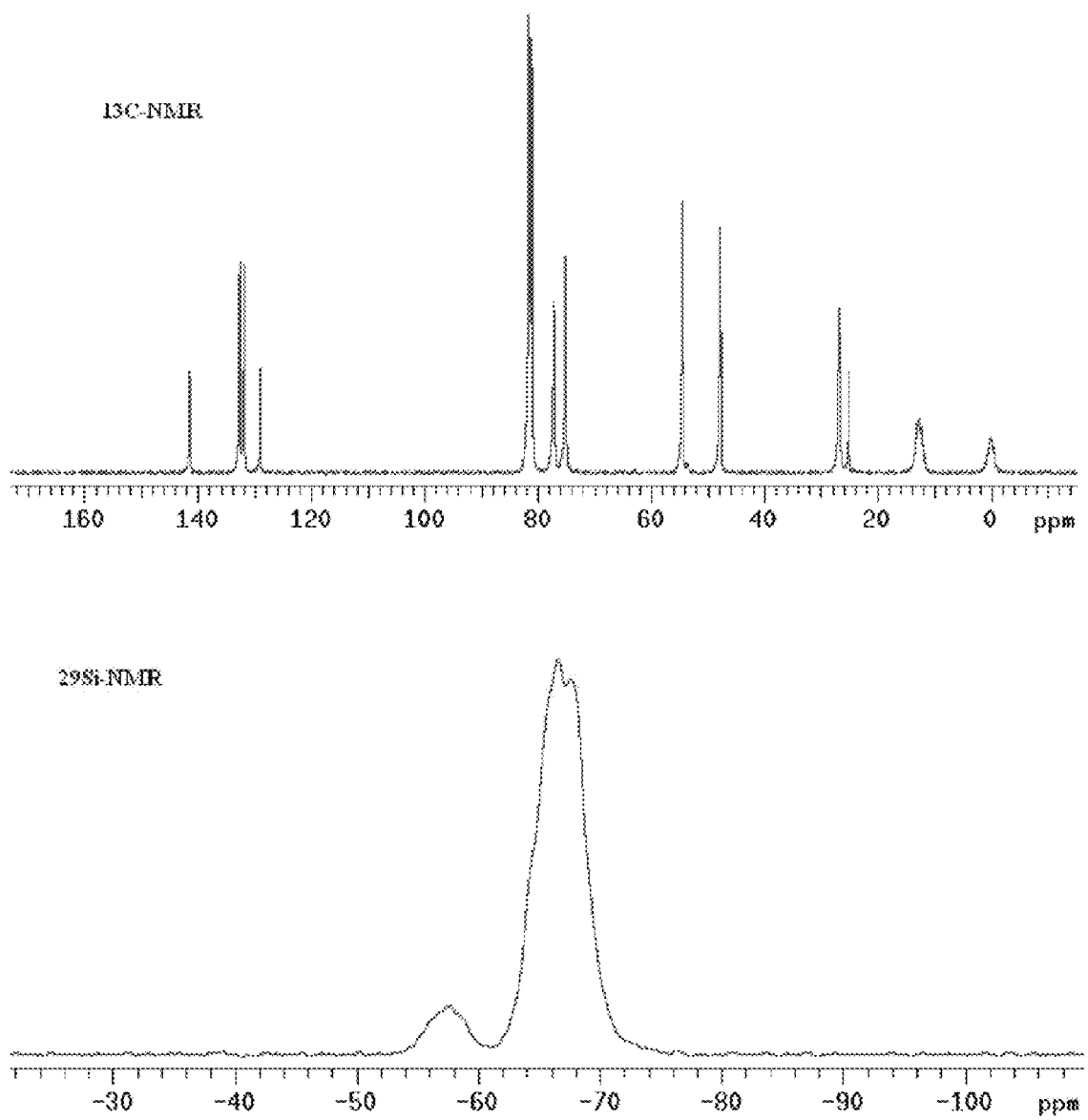
Figure 25:
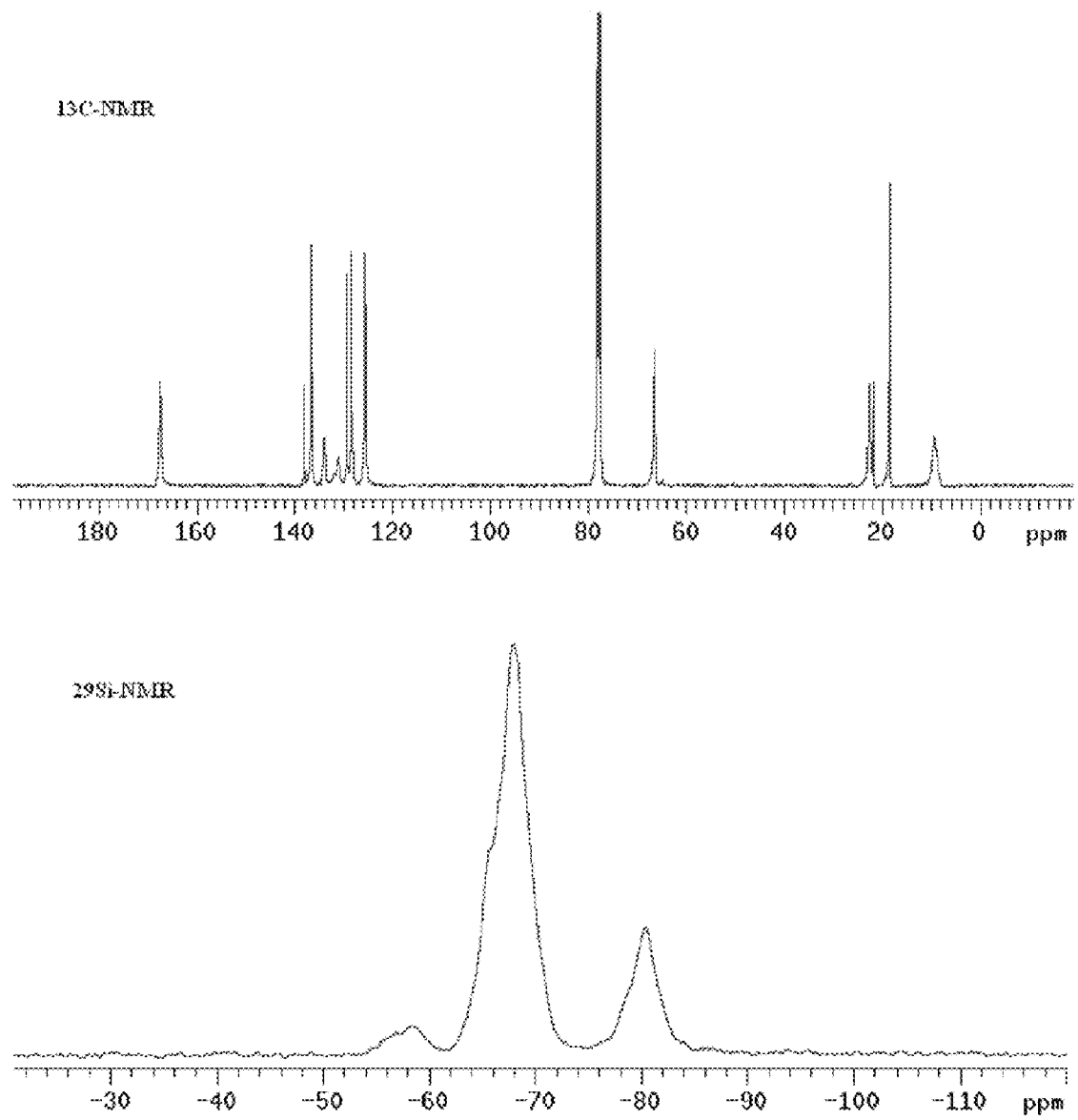
Figure 25:
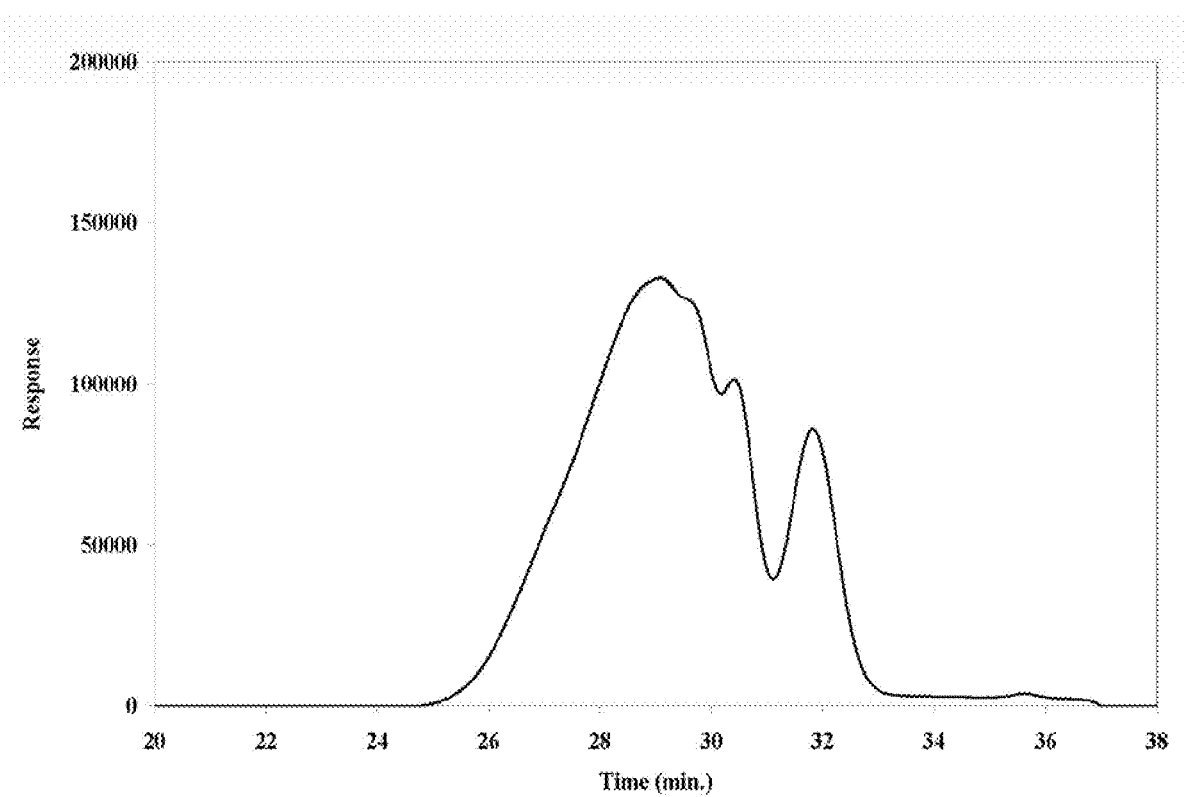
Figure 26:
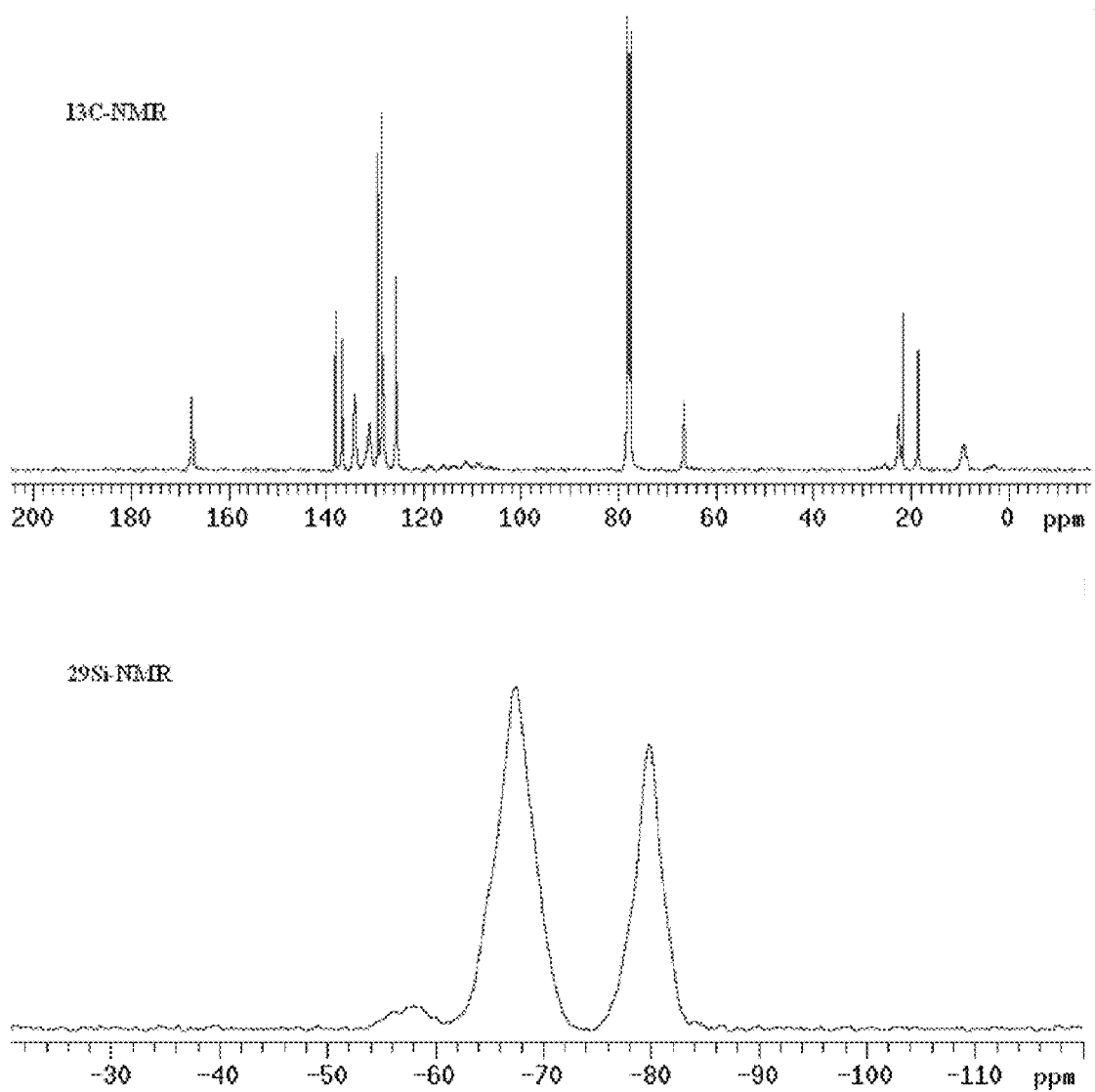
Figure 27:
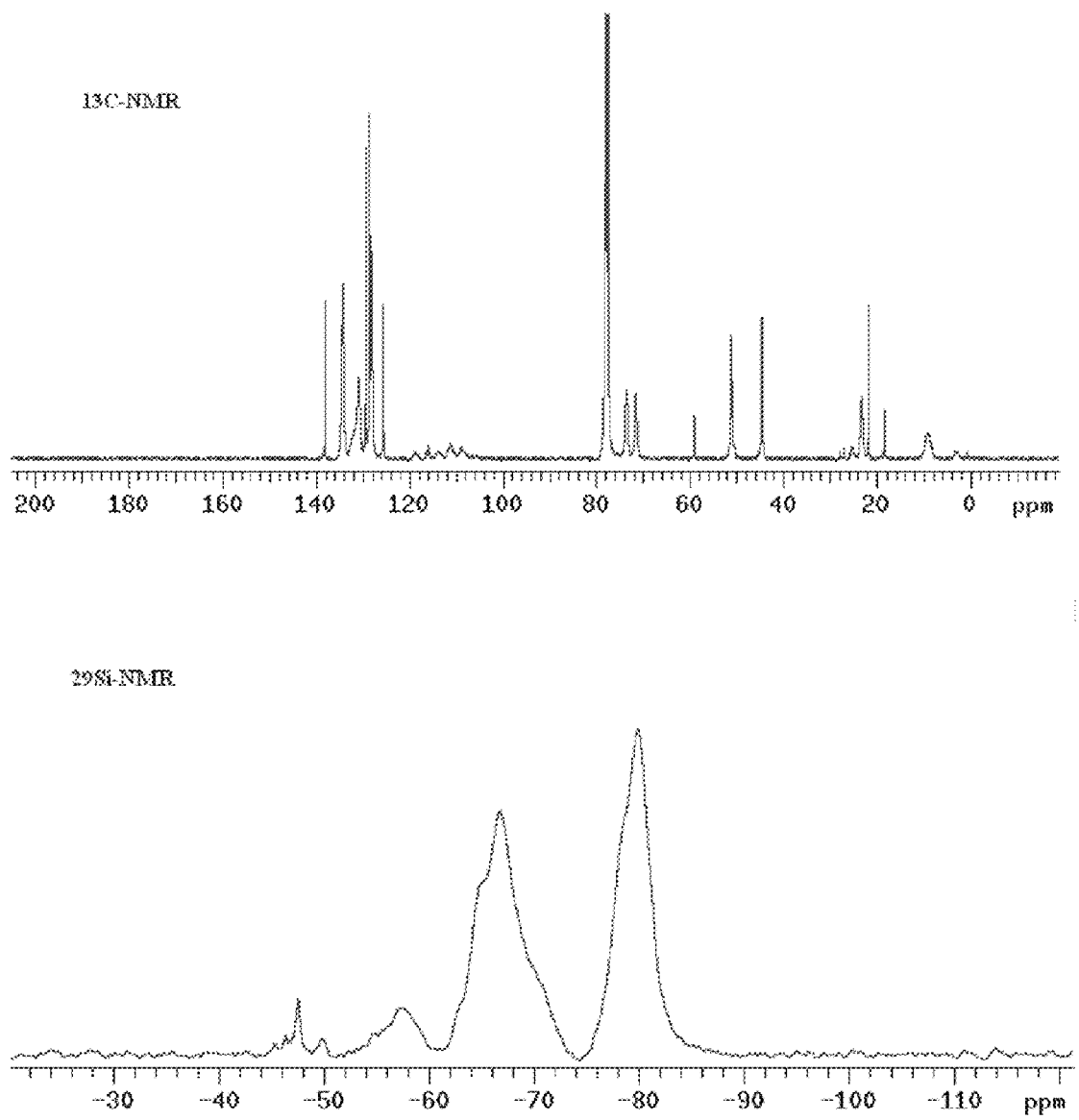
Figure 28:
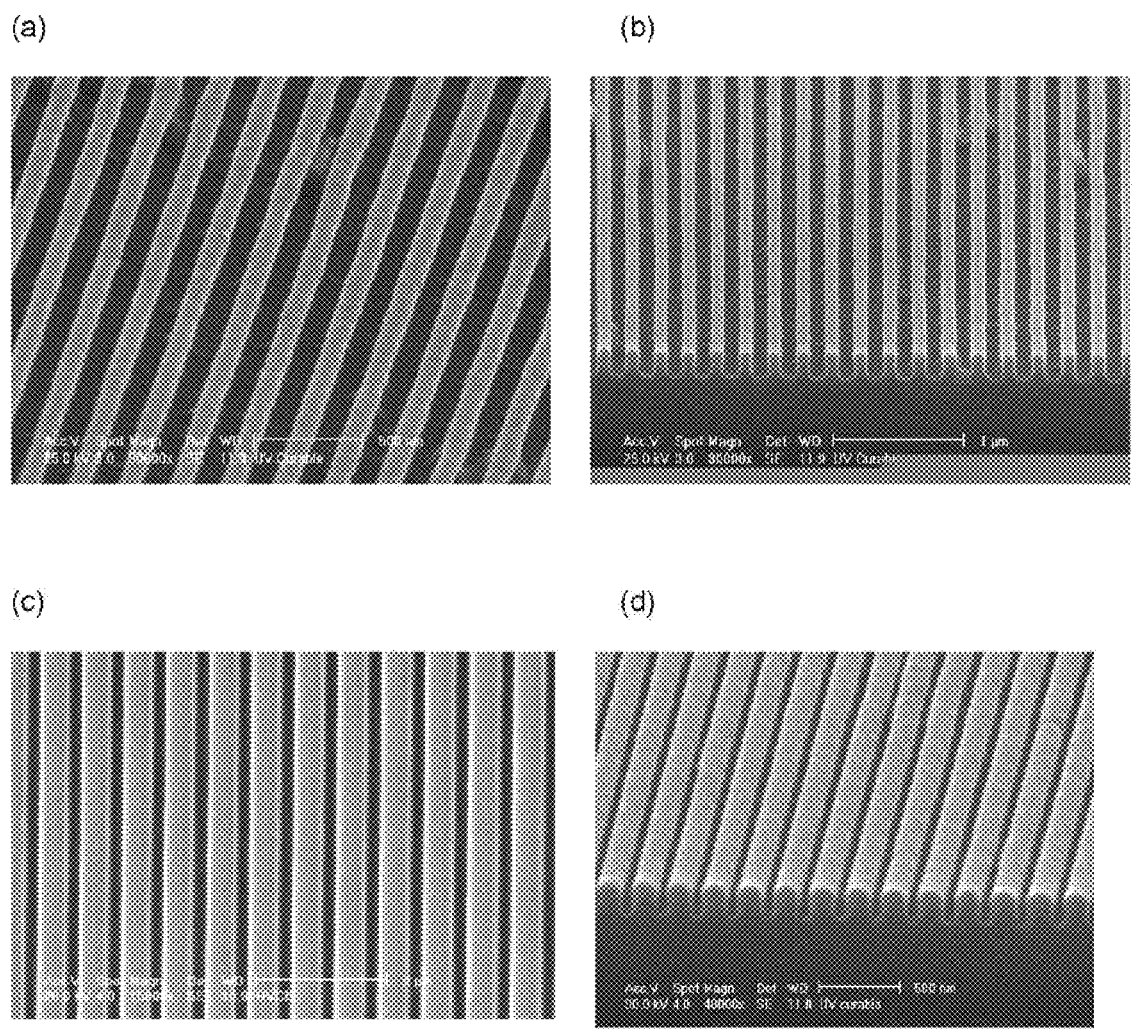
Figure 29:
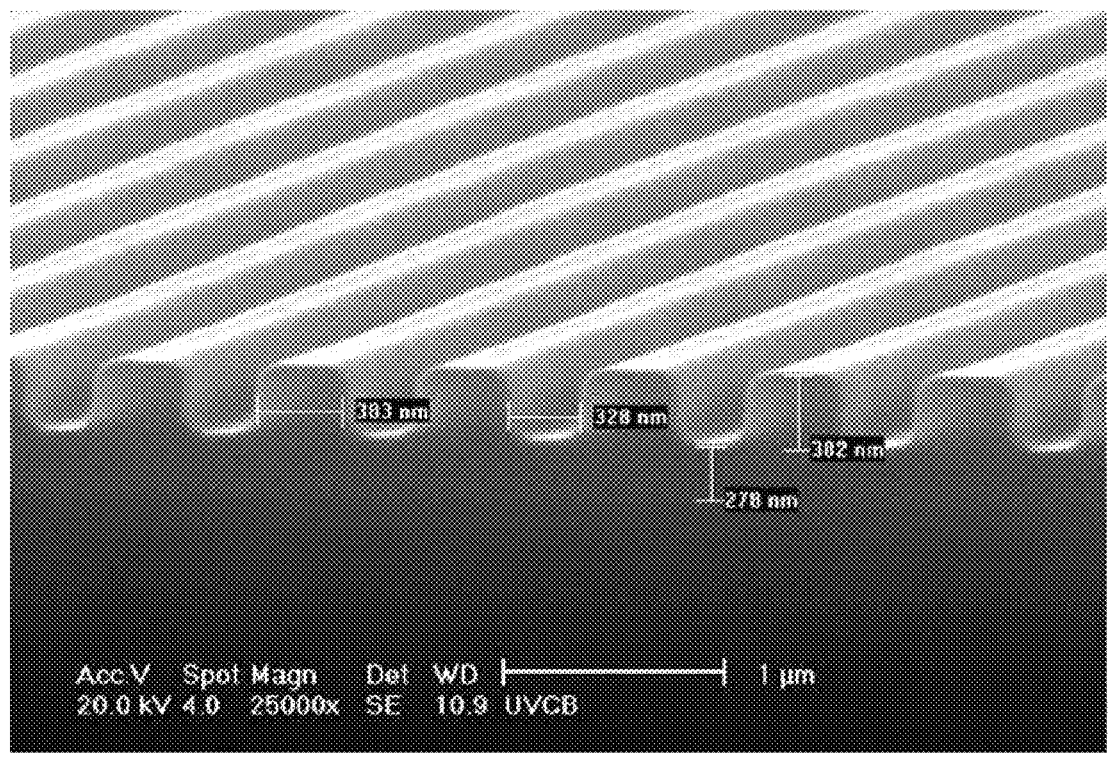
Figure 29:
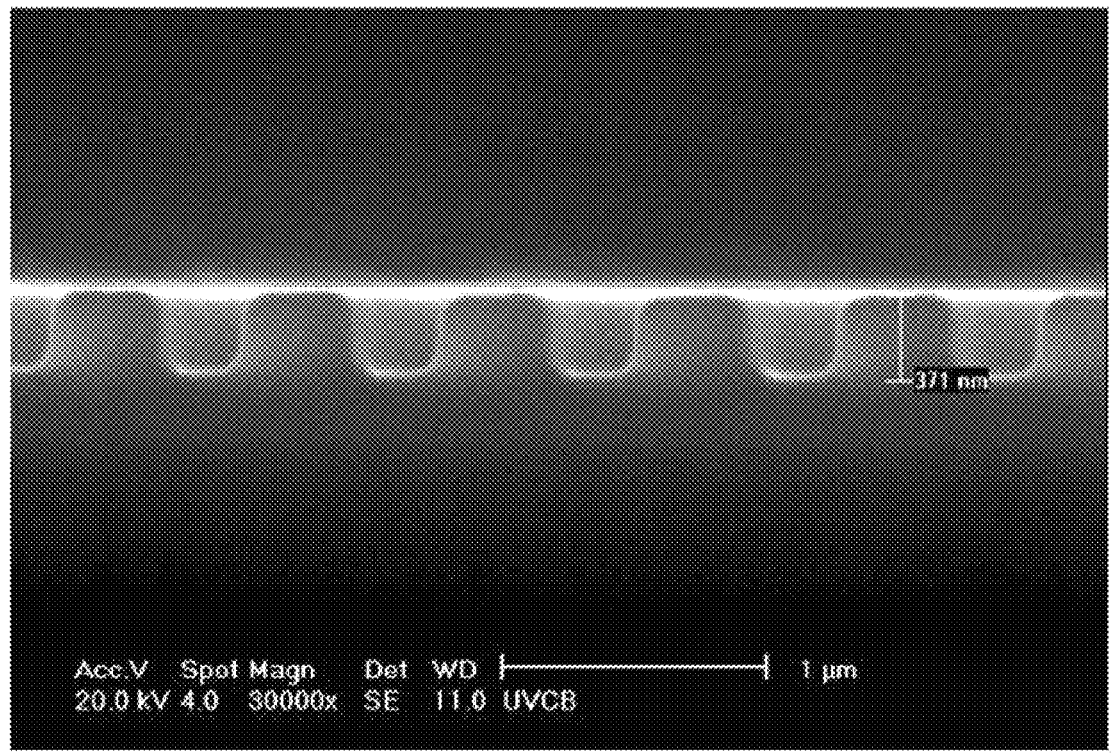

FIG. 7 graphically illustrates (a) IR characterization of Ph-SSQ (epoxy-based) material, showing absorbance vs. wavenumber at different UV radiation intensities; (b) conversion vs. exposure time for different UV light intensities; and (c) effect of the concentration of PAG on the degree of conversion;

FIG. 8 illustrates SEM images of 70 nm line width nanostructures replicated using (a) $T_{Me}T_{Ep}$ and (b) $T_{Ph}T_{Ep}$; 60 nm line width patterns replicated using an SSQ with (c) a high ratio of epoxy groups $T^{Ph}_{0.2}T^{Ph}_{0.8}$ and (d) $T^{Ph}_{0.5}T^{Ep}_{0.5}$ with a lower amount of epoxy groups; and additional nanostructures replicated with SSQ's containing phenyl groups (e) $T^{Ph}_{0.5}T^{Ep}_{0.5}$ and (f) $T^{Ph}_{0.5}T^{MA}_{0.5}$;

FIG. 9 illustrates (a) low surface energy fluoro-SSQ, (b) 20 nm pillar mold, (c) 20 nm pore structure replicated on fluoro-SSQ layer, and (d) schematic of one embodiment of a method used to imprint low surface energy fluoro-SSQ resin;

FIG. 10 illustrates the examples of the chemical structure of (a) $T^{Ph}T^{MA}$; (b) $T^{Ph}T^{MA}T^{Fluo}$; (c) $T^{Ph}T^{Ep}$; (d) $T^{Ph}T^{Ep}T^{Fluo}$;

FIG. 11 illustrates an example of a process to improve the adhesion between the PET substrate and the fluoro-SSQ material for the fluoro-SSQ stamp fabrication;

FIG. 12 illustrates SEM images of (a) 700 and (b) 220 nm period patterns produced in fluoro-SSQ;

FIG. 13 illustrates SEM images of resist patterns imprinted by using the fluoro-SSQ based stamp where (a) shows 700 nm pitch PDMS grating, and (b) and (c) show 700 nm 220 nm pitch grating patterns in $T^{Ph}T^{Ep}$ resin, respectively;

FIG. 14 illustrates an example of results of imprinting SSQ resins with a 700 nm period mold;

FIG. 15 illustrates SEM images of a 70 nm line width replicated pattern on SSQ materials;

FIG. 16 illustrates 200 nm period gratings etched into Si substrate by using patterned SSQ resist as an etch mask;

FIG. 17 illustrates an embodiment of an SSQ resin lift-off method;

FIG. 18 illustrates SEM images of an original pattern formed on a coated substrate by NIL using an SSQ resin;

FIG. 19 illustrates SEM images showing how residual SSQ resin located at the thinner portions of the SSQ resin pattern is removed to expose portions of the PMMA coating;

FIG. 20 illustrates SEM images showing how portions of the PMMA coating are removed to expose the underlying substrate and undercut the overlying SSQ resin;

FIG. 21 illustrates SEM images of Cr deposited onto the substrate, where the remaining portions of coating and overlying SSQ resin have been lifted off by solubilizing the coating with solvent;

FIG. 22 illustrates representative $^{13}C$ and $^{29}Si$-NMR spectra of $T^{Me}_{0.2}T^{Ep}_{0.8}$ from Example 1;

FIG. 23 illustrates representative $^{13}C$ and $^{29}Si$-NMR spectra of $T^{Me}_{0.3}T^{Ep}_{0.7}$ from Example 2;

FIG. 24 illustrates representative $^{13}C$ and $^{29}Si$-NMR spectra of $T^{MeEp}_{0.4}T_{(0.6}$ from Example 3;

FIG. 25 (a) illustrates representative $^{13}C$ and $^{29}Si$-NMR spectra of $T^{Ph}_{0.2}T^{MA}_{0.8}$ from Example 4; (b) illustrates a representative GPC chromograph of $T^{Ph}_{0.2}T^{MA}_{0.8}$ from Example 4;

FIG. 26 illustrates representative $^{13}C$ and $^{29}Si$-NMR spectra of $T^{Ph}_{0.2}T^{MA}_{0.8}T^{Fluo}_{0.1}$ from Example 7;

FIG. 27 illustrates representative $^{13}C$ and $^{29}Si$-NMR spectra of $T^{Ph}_{0.4}T^{MA}_{0.5}T^{Fluo}_{0.1}$ from Example 8;

FIG. 28 illustrates SEM images showing nano-patterns created using an epoxy-based silsesquioxane resin ($^{Ep}T^{Ph}T^{epoxy}$) resin with a cationic photo initiator (PAG), where panels (a) and (b) show a 70 nm line width pattern, panel (c) shows a 700 nm period pattern, and panel (d) shows 120 nm line width pattern; and FIG. 29 illustrates SEMs showing nano-patterns created using a methacrylate-based silsesquioxane resin ($T^{Ph}T^{MA}$) resin with a free-radical photo initiator.

DETAILED DESCRIPTION

The following description of technology is merely exemplary in nature of the subject matter, manufacture and use of one or more inventions, and is not intended to limit the scope, application, or uses of any specific invention claimed in this application or in such other applications as may be filed claiming priority to this application, or patents issuing therefrom. The following definitions and non-limiting guidelines must be considered in reviewing the description of the technology set forth herein.

The headings (such as "Introduction" and "Summary") and sub-headings used herein are intended only for general organization of topics within the present disclosure, and are not intended to limit the disclosure of the technology or any aspect thereof. In particular, subject matter disclosed in the "Introduction" may include novel technology and may not constitute a recitation of prior art. Subject matter disclosed in the "Summary" is not an exhaustive or complete disclosure of the entire scope of the technology or any embodiments thereof. Classification or discussion of a material within a section of this specification as having a particular utility is made for convenience, and no inference should be drawn that the material must necessarily or solely function in accordance with its classification herein when it is used in any given composition.

The citation of references herein does not constitute an admission that those references are prior art or have any relevance to the patentability of the technology disclosed herein. All references cited in the "Detailed Description" section of this specification are hereby incorporated by reference in their entirety.

The description and specific examples, while indicating embodiments of the technology, are intended for purposes of illustration only and are not intended to limit the scope of the technology. Moreover, recitation of multiple embodiments having stated features is not intended to exclude other embodiments having additional features, or other embodiments incorporating different combinations of the stated features. Specific examples are provided for illustrative purposes of how to make and use the apparatus and systems of this technology and, unless explicitly stated otherwise, are not intended to be a representation that given embodiments of this technology have, or have not, been made or tested.

As referred to herein, all compositional percentages are by weight of the total composition, unless otherwise specified. As used herein, the word "include," and its variants, is intended to be non-limiting, such that recitation of items in a list is not to the exclusion of other like items that may also be useful in the materials, compositions, devices, and methods of this technology. Similarly, the terms "can" and "may" and their variants are intended to be non-limiting, such that recitation that an embodiment can or may comprise certain elements or features does not exclude other embodiments of the present technology that do not contain those elements or features.

"A" and "an" as used herein indicate "at least one" of the item is present; a plurality of such items may be present, when possible. "About" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. In addition, disclosure of ranges includes disclosure of all distinct values and further divided ranges within the entire range.

The present technology relates to radiation-curable resins for use as resists and lithographic methods employing these resins. The resins include low viscosity liquid resists that can be spin-coated or dispensed as droplets on a substrate and subsequently cured photo-chemically, thermally, or both photo-chemically and thermally; e.g., dual cure resins. For example, the present disclosure provides a radiation-curable technique based on cationic polymerization of epoxy-containing silsesquioxane (SSQ) resins at room temperature and low pressure. The present disclosure also provides radiation-curable silsesquioxane (SSQ) resins that can be used as the imprint resist for micro- and nanoimprinting lithography. The present compositions and methods may be used to increase throughput and reduce costs for nanolithographic techniques and manufacturing processes. For example, nanoimprint lithography (NIL) using the present compositions may be used to replace photolithography in the manufacture of integrated circuits. The present NIL and patterning approaches offer micro- and nano-scale replication with high precision, accuracy, and throughput at low cost.

Figure 1:
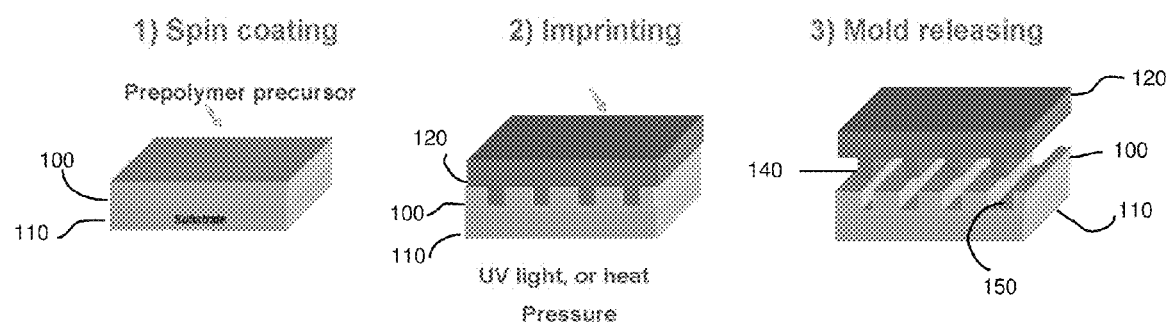
FIG. 1 is a schematic of one embodiment of a nanoimprint lithography (NIL) process.

In NIL, the resist material is placed in contact with a mold and mechanically deformed under an applied load in order to transfer an inverse image of the original mold features into the resist. With reference to FIG. 1, a schematic illustrating three stages of the NIL process is shown. A resist composition including a prepolymer precursor, such as a UV-reactive monomer, is spin coated onto a substrate. Contact is made between the resist-coated substrate and a mold having micro- and/or nano-scale features, imprinting a negative or inverse impression or image of the mold in the resist. UV light and/or heat are applied to cure or partially cure the resist, and optionally pressure may be applied to ensure all or substantially all of the mold features are contacted by the resist. The mold is then released and separated from the resist-coated substrate, leaving a micro- and/or nano-scale patterned layer on the substrate. As referred to herein, forming nano-scale features and structures via NIL (i.e., images and patterns having nanometer dimensions) also allows for forming larger micro-scale features and structures (i.e., micrometer dimensions) and simultaneously forming both nano-scale and micro-scale features and structures.

In some embodiments, the present disclosure provides an NIL system for micro- and nanolithography using contact exposure tools or other appropriate equipment. Liquid resist may be spin-coated onto a variety of substrates with high uniformity allowing the resist thickness to be precisely controlled. The low viscosity of the liquid resist allows imprinting with low pressure and low temperature, including room temperature. The resist may be a radiation-curable silsesquioxane resin. For high-speed continuous roll-to-roll nanoimprinting, other techniques such as die-coating, spray-coating, or jet-coating can be used.

In some embodiments, a resist layer may be covered with a mask and etched. For example, a mask may be used to in conjunction with chemical etching to remove unmasked material from the resist layer. For example, resist comprising silsesquioxane resin may provide increased dry etching resistance and also make it easier to separate the resist from the mask. Due to its high modulus after cure, silsesquioxane resin can also allow the fabrication of micro- and nano-features having high aspect ratios.

The present compositions include SSQ resins having radiation-curable groups that can cure and solidify the resist within a few seconds or less at room temperature. Radiation-curing may be performed using thermal radiation, such as heat, using actinic radiation, for example, such as electron beam or electromagnetic radiation such as UV light. In some cases, radiation-curing may be performed by dual-cure, using both thermal and actinic radiation. As illustrated herein, resins or polymers that undergo radiation-curing or curing upon exposure to actinic radiation, like UV light, are referred to as radiation-curable. For example, the resist composition may include radiation-curable monomers or oligomers that are cured or partially cured in times ranging from about a few minutes to about a few seconds. As such, the replicated pattern in the resist is not subject to mechanical distortions during a typical heating-cooling cycle. Viscosity of the pre-polymeric precursors may be adjusted so that low pressure (e.g., about 50 psi or less), if any, may be used during the imprinting process. In addition, the present resists may include more than one component in order to achieve the desired and unique properties. For example, radiation-curable materials may be combined with other materials to adjust the viscosity, curing rate, and resultant polymer properties. The liquid resist composition may be a radiation-curable silsesquioxane resin, where the resist includes at least one radiation-curable silsesquioxane resin and a photo-initiator. In addition, solvent may be included to provide a low viscosity for spin-coating thin films, for example.

In some embodiments, a method for duplicating an original nanoimprint mold uses a fluorinated radiation-curable silsesquioxane (SSQ) resin cast on a substrate, including hard or flexible substrates. With an appropriate viscosity, the SSQ resin can be spin coated on the substrate, and the original mold can be replicated in this resin by using a low pressure nanoimprinting process. For example, the original mold may comprise a $SiO_2$ mold.

The SSQ resin has a sufficient modulus in its cured state that makes it stable and makes it suitable for nanoimprinting other polymeric materials. A high modulus material facilitates high pattern fidelity and definition of replicated structures, and further serves to prevent lateral collapsing of structures during mold releasing. A high strength resist also helps to avoid cracking and breaking of structures during mold release. Due to the high thermal stability and UV transparency of SSQ materials, the imprinted and cured SSQ resin may itself be used as a stamp or mold in subsequent UV and thermal nanoimprinting. Furthermore, the fluoroalkyl groups contained in the silsesquioxane resin may provide a low surface energy for easy demolding after nanoimprinting. These several features make radiation-curable SSQ resin, such as for example fluorinated SSQ resins, well suited to fabricate a multitude of duplicates from an original nanoimprint lithography master for mass fabrication.

The present compositions and methods are suitable for use with the methods and techniques provided in U.S. Pat. Appl. Pub. No. 2009/0046362 to Guo et al. and PCT Pub. No. WO/2008/124180, including the Combined-Nanoimprint-and-Photolithography techniques disclosed therein, which can greatly simplify the process of patterning nanostructures. In addition, compositions and synthesis methods suitable for use with the present SSQ resins include those described in U.S. Pat. Appl. Pub. No. 2008/0318436 to Fu et al. and PCT Pub. No. WO/2007/094848.

In some embodiments, the resist compositions may include a SiO-containing polymer having radiation-curable groups, a photo-initiator, and optionally a solvent. The SiO-containing polymer may include SiO moieties in the polymer backbone. The polymer may be an organosiloxane, such as an organosilsesquioxane. The polymer can include solution and film-forming characteristics conducive to forming a layer by conventional spin-coating methods, such as appropriate viscosity and solvent evaporation rate.

Silsesquioxanes (SSQ) can be formed by the hydrolytic condensation of trichlorosilanes or triakoxysilanes, and exhibit many unique properties, such as thermal stability, optical clarity, high density, and oxidative stability. SSQs are a class of organic-inorganic hybrid materials that include silicon and oxygen atoms with the empirical formula of $RSiO_x$, where R can be an organic or inorganic group and x is about 1.5. These polymers present outstanding properties such as high modulus (in the order of GPa), high thermal stability, and provide a low dielectric constant (e.g., less than about 3) useful for interlayer dielectrics, photonic waveguide and device materials, and protective and insulating coatings. Thus, SSQ materials have found several applications in fields as diverse as medicine, electronics, optics, and aerospace.

Depending on the synthetic procedure employed, silsesquioxanes can form a variety of molecular structures such as random, ladder, cage, and partial cage structures. In addition, a variety of chemical groups can be chosen to provide adequate adhesion of the resist to the substrate while also providing an easy mold release. This dual function can be achieved through molecular design, where low surface energy groups (e.g., methyl groups) tend to migrate to the surface, while high surface energy groups (e.g., silanol groups) stick to the substrate, permitting the imprinted resist patterns to adhere to the substrate rather than to the mold. Also, a variety of functionalities can be chosen to allow the resists to crosslink via a photo-initiated free radical and/or a cationic polymerization process. Thus, the crosslinking moieties on the SSQ structure can allow radiation-chemical curing of the resin within seconds using a number of different atmospheric conditions.

SSQ resins possess other significant properties that are also desirable for NIL applications. Their high silicon content provides great etch resistance to reactive ion etching (RIE), for example. Moreover, their chemical structure can be tuned according to required needs. For instance, a variety of functional groups can be chosen to allow the present resists to be crosslinked via a UV-initiated free radical or cationic polymerization process.

Figure 2:
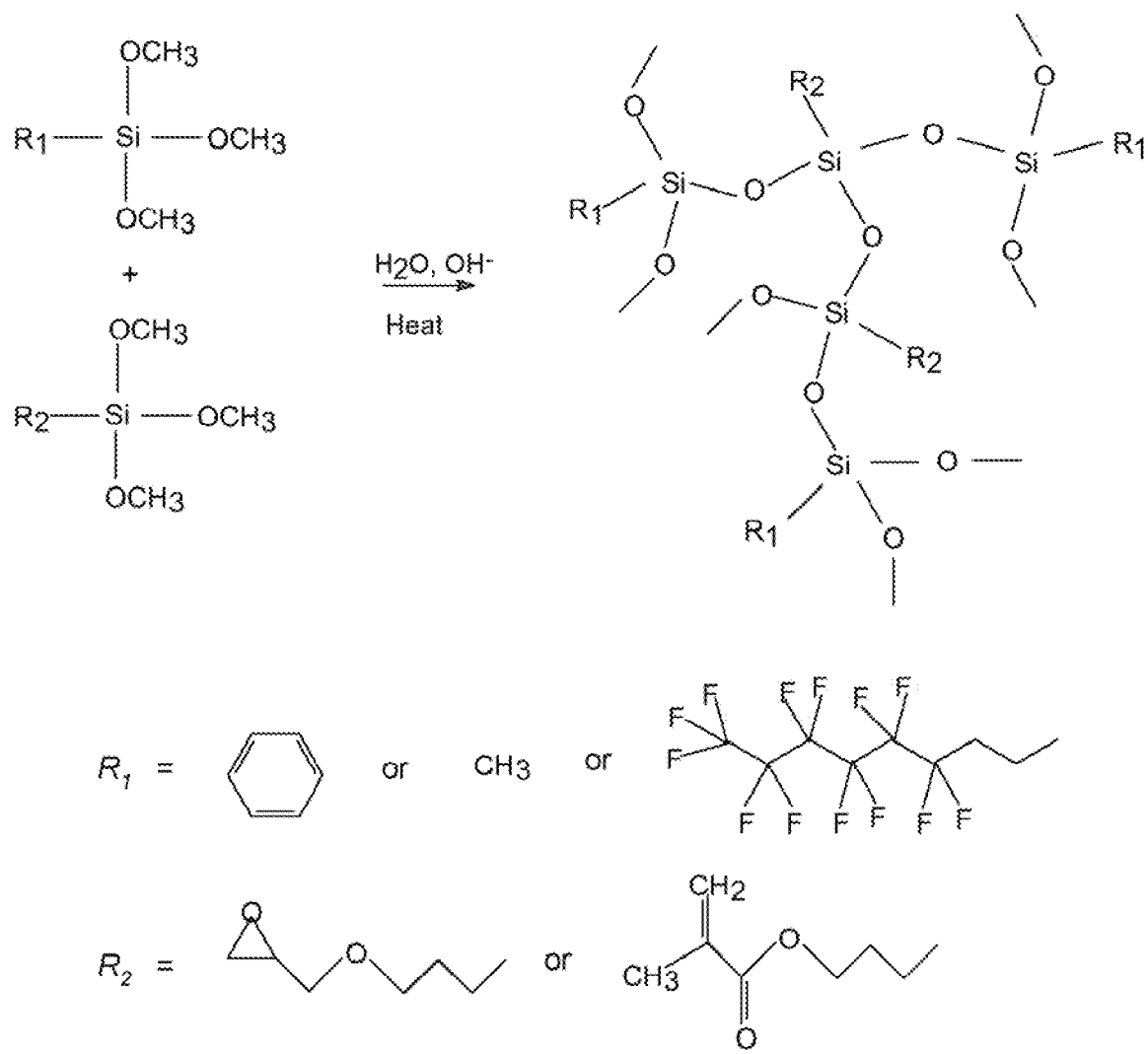
FIG. 2 illustrates a cohydrolyzed condensation mechanism for synthesis of silsesquioxane ("SSQ") resins.

In some embodiments, the resist composition includes silsesquioxane resin as a prepolymer resist for NIL. Synthesis of the SSQ resin generates a mixture of random, ladder, cage, and partial cage structures. In contrast to all-cage structured polyhedral silsesquioxanes, such as $T_8$ and $T_{12}$, a higher molecular weight of the present SSQ resin allows formation of highly stable thin films that do not exhibit any appreciable dewetting behavior. In addition, the viscosity of the SSQ resin in neat or solution may still be low enough for successful patterning of nano-scale features and structures using low pressure; e.g., less than or about 50 psi. The resin is synthesized through a hydrolytic condensation of trifunctional silanes $XSiY_3$, a versatile approach that allows an easy engineering of their properties. An example of a cohydrolyzed condensation mechanism for the synthesis of SSQ resins is illustrated in FIG. 2.

The chemical composition of these SSQ materials was carefully designed to produce a resist with a high mechanical integrity, easy mold releasing and strong substrate adhesion to achieve the replication of nanoscale structures with high fidelity and definition. Furthermore, choosing the right conditions, the crosslinking time of the curable liquid can be reduced to about a few seconds (<5 sec) or less. Finally, the inorganic framework of this silicon based polymers allows them to present a high etch selectivity and low roughness after RIE etching.

In general, the present SSQ resin preferably includes one or more monomers from each of formulas (I) and (II):

(I)

(II)

In formulas (I) and (II), x is from about 1 to about 1.5, $R^1$ comprises a base moiety, and $R^2$ comprises a radiation-chemically reactive site for crosslinking. For example, in generally linear organosiloxane polymers, x would equal about 1. For silsesquioxane polymers, x would equal about 1.5 (also denoted as the fraction "3/2"). Generally, silsesquioxane polymers are preferred based on their greater etch resistance.

With further regard to formulas (I) and (II), in some embodiments, each $R^1$ group may be independently selected from hydrogen; C1-C12 alkyl groups, such as methyl, ethyl, and propyl groups; unsaturated groups, including vinyl groups; and aryl groups, including phenyl groups; carboxylate groups, such as ester groups, carboxylic acid groups; and ether groups. Each $R^2$ independently comprises a radiation-curable group that forms a crosslinking network following irradiation, where each $R^2$ may be selected from acrylate, epoxy, and vinyl ether groups. Each X in formulas (I) and (II) can be from about 1 to about 1.5.

Examples of radiation-curable groups may include those shown below, wherein q is selected from about 1 to about 10 and $R^a$ is a hydride or methyl group:

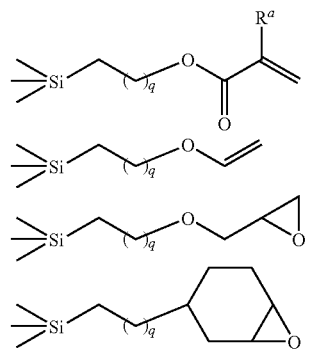

In some embodiments, the SSQ resin may be synthesized by hydrolysis and condensation of one or more alkoxysilanes. A representative reaction includes the following:

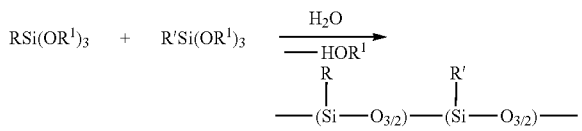

wherein R is a member of the group selected from C1-C12 alkyl groups, including methyl, ethyl, and propyl groups; aryl groups, including phenyl groups; and other suitable organic groups, such as carboxylate groups and ether groups; and R' is a radiation-curable organic group. Radiation-curable organic groups include epoxy, acrylate, or vinyl ether groups. $R^1$ is independently an alkyl group, such as methyl or ethyl group, or —$OR^1$ is an acetoxy group, —O—C(O)—$R^2$, wherein $R^2$ is a alky group.

Additional examples of resists comprising silsesquioxane resins include compositions having the following formulas: $[RSiO_{3/2}]_m[XSiO_{3/2}]_n(T^R T^X)$; $[RSiO_{3/2}]_m[XSiO_{3/2}]_n[R'_2SiO]$ $(T^R T^X D^{R'})$; $[RSiO_{3/2}]_m[XSiO_{3/2}]_n[R'_2SiO]$ $(T^R T^X D^{R'})$; and $[RSiO_{3/2}]_m[XSiO_{3/2}]_n[R'_2SiO][SiO_2]$ $(T^R T^X D^{R'} Q)$; where R is an organic group or a mixture of groups, such as H, methyl, ethyl, other alkyl, phenyl, vinyl, etc; X is a radiation-curable group known in the art that forms crosslinking network when irradiated, such as acrylate, epoxy, vinyl ether, etc.; and R' is H, methyl, ethyl, other alkyl, phenyl, vinyl, etc. The shorthand notation (M, D, T, and Q) for siloxane polymers is well known in the art, as described in W. Noll, "Chemistry and Technology of Silicones", Academic press, Orlando, 1968; pp 1-9. The notation "T" refers to tri-functional, "D" refers to di-functional, and "Q" refers to quaternary-functional groups. For example, the present compositions include T units, which may be mixed with D and/or Q units; wherein the D unit can give the material more flexibility and elasticity, and Q can increase the hardness and modulus of the material. In this way, the modulus of the material may be tailored for particular applications.

Besides providing mechanical stability, radiation-curable groups may also promote adhesion if the substrate is functionalized with the appropriate chemistry. In addition, the silanol groups (i.e., SiOH), present in the resin and formed during the hydrolysis step, may further enhance adhesion of the resin to the substrate. The release function and suitable mechanical properties are provided by methyl or phenyl groups, but low surface energy perfluoroalkyl groups are especially helpful to aid in mold release for nanoscale patterning.

A comparison can be made between the present SSQ resist material and the liquid resists used for Step-and-Flash Imprint Lithography (SFIL). In SFIL, the imprinting pressure is very low (less than a few psi) and the resist is a mixture of low molecular monomer (typically below 400 g/mol) and is a very low viscosity liquid (typically<0.1 Pa·s). However, there are some drawbacks of using very small molecules. First, the resist can exhibit considerable shrinkage (~15%) upon curing, impacting the dimensionality of the replicated patterns. Second, the material may not completely cure or crosslink; e.g. if 90% of the precursor is cured, the remaining 10% of monomers, being small and relatively volatile molecules, could become a significant outgassing source, potentially creating defects and issues for process integration. Third, such liquid resist is not suitable for spincoating because the film easily dewets due to its low viscosity. Finally, the low molecular weight of SFIL resist components causes fast evaporation leading to inhomogeneities in pattern replication.

In contrast, the present resist compositions of SSQs with relatively high molecular weights (typically in the range of about 1,000 g/mol to about 6,000 g/mol) exhibit significantly reduced or nonexistent outgassing issues, as opposed to the outgassing issues frequently encountered with low molecular weight silanes and silyl-grafted organic polymers. This property is very attractive for achieving high yield in nanolithography for Si chip fabrication, for example. The molecular weight of the present SSQ resins also allows the formation of highly stable thin films with a good wetting behavior. On the other hand, the viscosity of the present SSQ prepolymers, ranging from about 1 Pa·s to about a few hundred Pa·s, which may be adjusted with the addition of solvents, is much lower than the viscosities normally observed in thermoplastic polymers at high temperatures (e.g., several thousand Pa·s). The present resist compositions therefore can achieve successful patterning of nanometric sized structures under low pressure (e.g., less than or about 50 psi).

Silsesquioxane resins with a variety of chemical functionalities may be synthesized through the hydrolytic condensation of trialkoxysilanes. These resins can be made using variable molar ratios of silanes with different chemical functionalities in order to adjust the effect and influence of the substituent group and its content on the properties of the resist material. For example, phenyl and methyl groups can be incorporated into the SSQ resin. In addition, methacryloxypropyl and glycydoxypropyl functionalities may be included in the silsesquioxane resin in order to perform either free radical or cationic UV-initiated crosslinking, respectively. The cationic process offers the advantage that it can be carried out under an oxygen atmosphere, in contrast to free radical crosslinking, which may require an inert environment due to oxygen inhibition.

In some embodiments, the SSQ resin may be modified with a fluoro-containing organic substituent, including a perfluoroalkyl substituent to generate a resist with a low surface energy. The surface energy of the resist can play a significant role in the quality and size of the final imprinted area. A high surface energy resist may generate defects on the imprinted pattern due its strong adhesion to the mold. On the other hand, if the surface energy of the resist is too low, adhesion to the substrate will be weak and the resist will stick to the mold during the mold releasing process. The amount and type of the fluoro-containing organic substituent may be adjusted to provide low adhesion to the mold without compromising adherence of the resist to the substrate.

Figure 3:
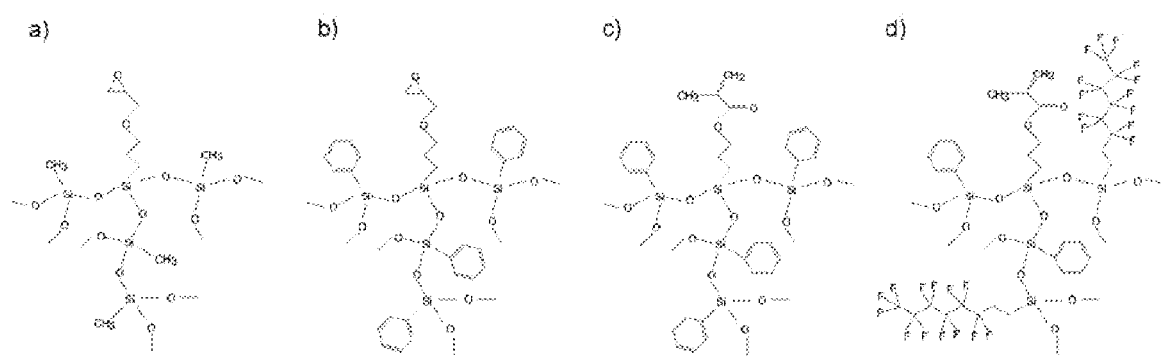
FIG. 3 illustrates chemical structures for examples of SSQ prepolymers characterized in the present disclosure, showing: (a) methyl-SSQ (epoxy-based); (b) phenyl-SSQ (epoxy-based); (c) phenyl-SSQ (methacrylate-based); and (d) ooctylperfluorinated phenyl-SSQ (methacrylate-based)

Referring now to FIG. 3, the present resist compositions may include one or more of the SSQ resins illustrated in (a)-(d). Panel (a) shows methyl-SSQ (epoxy based) resin, panel (b) shows phenyl-SSQ (epoxy based) resin, panel (c) shows phenyl-SSQ (methacrylate based) resin, and panel (d) shows a perfluorinated phenyl-SSQ (methacrylate based) resin.

With reference to Table 1, ten examples of the present SSQ resins were produced with the indicated molecular weights and appearance. The composition of SSQ resins can be designated as the amount of organic silane substituent and the amount of radiation-curable silane substituent using the notations: $T^{Me}_x T^{Ep}_y$, $T^{Ph}_x T^{Ep}_y$, and $T^{Ph}_x T^{Me}_y$; where $T^{Me}$ represents -(MeSiO$_{3/2}$)— unit, $T^{Ph}$ represents -(PhSiO$_{3/2}$)— unit, $T^{Ep}$ represents -(EpSiO$_{3/2}$)— unit, wherein Ep is 3-gycidyloxypropyl, $T^{MA}$ represents -(MASiO$_{3/2}$)— unit, wherein MA is 3-(Methacryloyloxy)propyl group, and x and y are the molar ratios of each of the silane units, where x+y=100. This notation may also be shortened, for example, where MeEp20 denotes $T^{Me}_{0.8} T^{Ep}_{0.2}$, and is also referred to herein as MA or Ac, where for example "PhAc20" represents $T^{Ph}_{0.8} T^{MA}_{0.2}$.

The molar ratios may be varied to tailor the properties of the SSQ resin for particular applications and features, as desired. Physical analysis of these example resins was performed in order to illustrate the influence of the substituent group(s) content in both the uncured prepolymer as well as on the final cured and crosslinked material. Physical characteristics of these synthesized SSQ materials are summarized in Table 1.

TABLE 1

Characteristics of Selective UV-curable SSQ resins synthesized using methyltrimethoxysilane, phenyltrimethoxysilane, (3-gycidyloxypropyl)trimethoxysilane (GPTMS), [3-(Methacryloyloxy)propyl]-trimethoxysilane (MPTMS), and 1H,1H,2H,2H-perfluorooctyltrimethoxysilane: Molecular weight and physical appearance at RT.

| Example | Composition[a] | GPC result[b] Mw | PDI | Appearance |
|---|---|---|---|---|
| 1 | $T^{Me}_{0.2} T^{Ep}_{0.8}$ | 3755 | 1.97 | Viscous liquid |
| 2 | $T^{Me}_{0.3} T^{Ep}_{0.7}$ | 4454 | 2.17 | Viscous liquid |
| 3 | $T^{Me}_{0.4} T^{Ep}_{0.6}$ | 4936 | 2.25 | Viscous liquid |
| 4 | $T^{Ph}_{0.2} T^{MA}_{0.8}$ | 4487 | 1.69 | White powder |
| 5 | $T^{Ph}_{0.4} T^{MA}_{0.6}$ | 26175 | 7.53 | Viscous liquid |
| 6 | $T^{Ph}_{0.4} T^{MA}_{0.58} T^{Fluo}_{0.02}$ | 2611 | 1.49 | Viscous liquid |

TABLE 1-continued

Characteristics of Selective UV-curable SSQ resins synthesized using methyltrimethoxysilane, phenyltrimethoxysilane, (3-gycidyloxypropyl)trimethoxysilane (GPTMS), [3-(Methacryloyloxy)propyl]-trimethoxysilane (MPTMS), and 1H,1H,2H,2H-perfluorooctyltrimethoxysilane: Molecular weight and physical appearance at RT.

| Example | Composition[a] | GPC result[b] Mw | PDI | Appearance |
|---|---|---|---|---|
| 7 | $T^{Ph}_{0.4}T^{MA}_{0.5}T^{Fluo}_{0.1}$ | 3103 | 1.58 | Viscous liquid |
| 8 | $T^{Ph}_{0.4}T^{Ep}_{0.5}T^{Fluo}_{0.1}$ | 2459 | 1.51 | Viscous liquid |
| 9 | $T^{Ph}_{0.5}T^{Ep}_{0.5}$ | 5149 | 2.32 | White powder |
| 10 | $T^{Ph}_{0.8}T^{Ep}_{0.2}$ | 8881 | 3.23 | White powder |

[a]Ep = 3-glycidoxypropyl group; MA = 3-(methacryloxy)propyl group; Fluo = 1H,1H,2H,2H-perfluorooctyl group;
[b]GPC data vs. polystyrene standard.

It was found that increasing the molar ratio of either phenyl or methyl groups eventually leads to a resin with solid-like characteristics. Only resins with liquid properties were further analyzed. All of the resins were soluble in common organic solvents, such as propylene glycol monomethyl ether acetate (PGMEA) and toluene.

The silsesquioxane resin is typically produced in the presence of a solvent. Any suitable organic or silicone solvent that does not contain a functional group which may participate in the reaction may be used in producing the silsesquioxane resin. The solvent is generally used in an amount of about 40 to about 98 weight percent based on the total weight of solvent and silane reactants, alternatively about 70 to about 90 weight percent. The reaction may be carried out as a dual phase or single-phase system.

Organic solvents useful with the present SSQ resins, and useful in synthesis of the present resins, include: saturated aliphatics such as n-pentane, hexane, n-heptane, and isooctane; cycloaliphatics such as cyclopentane and cyclohexane; aromatics such as benzene, toluene, xylene, mesitylene; ethers such as tetrahydrofuran, dioxane, ethylene glycol dietheyl ether, ethylene glycol dimethyl ether; ketones such as methylisobutyl ketone (MIBK) and cyclohexanone; halogen substituted alkanes such as trichloroethane; halogenated aromatics such as bromobenzene and chlorobenzene; esters such as isobutyl isobutyrate and propyl propronate. Useful silicone solvents include cyclic siloxanes, such as octamethylcyclotetrasiloxane and decamethylcyclopentasiloxane. A single solvent may be used or a mixture of solvents may be used.

Figure 4:
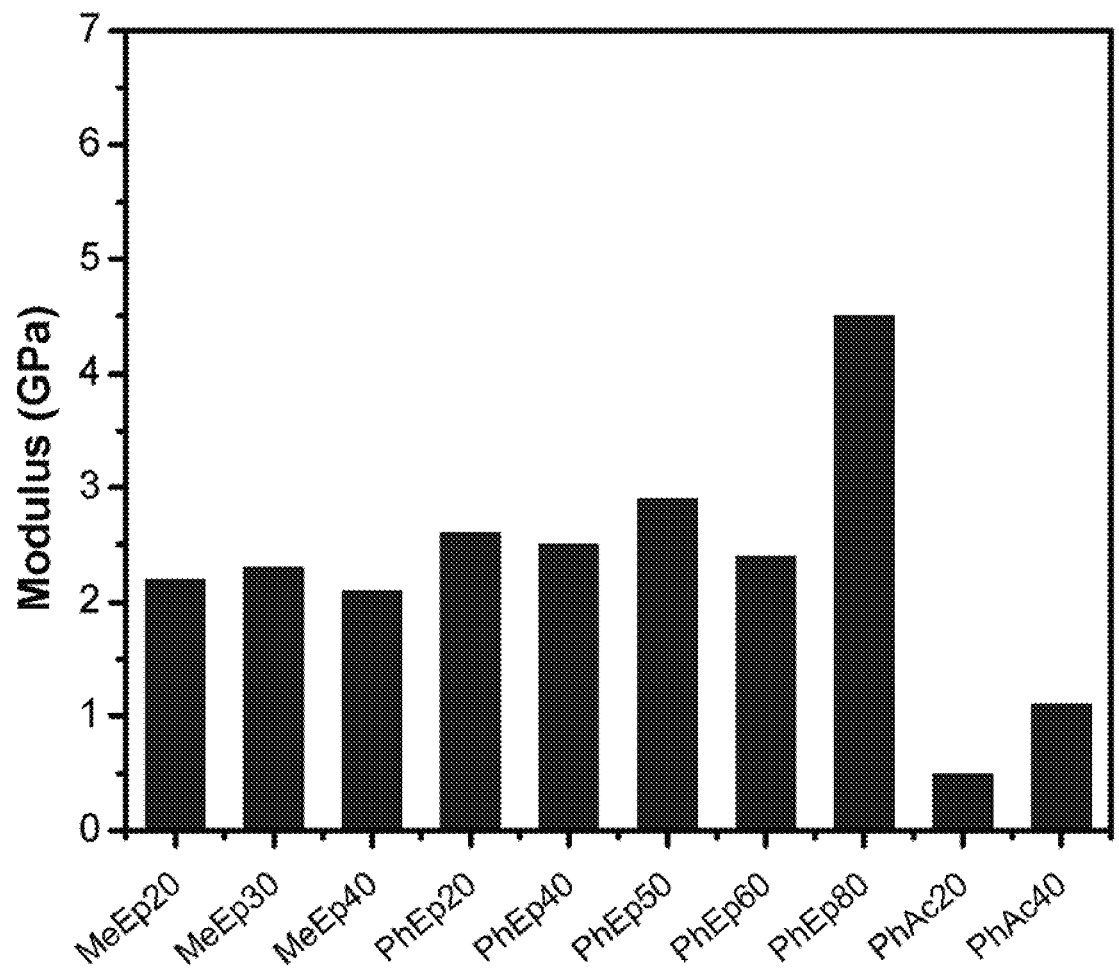
FIG. 4 illustrates the modulus of examples of the UV cured SSQ resins measured by nanoindentation.
Figure 5:
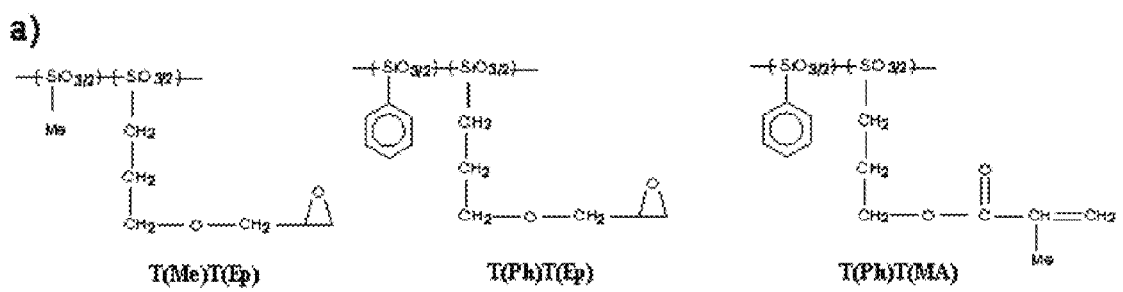
FIG. 5 illustrates (a) chemical structures of SSQ resin examples; (b) modulus of the UV cured SSQ resin examples measured by nanoindentation; and scanning electron micrographs (SEM) of (c) 350 nm and (d) 120 nm line width grating structures.
Figure 5:
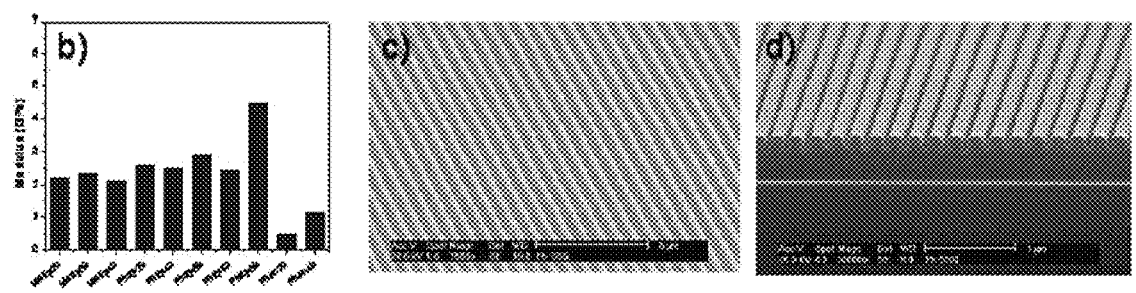

A material with a modulus larger than 8.0 MPa can prevent collapsing of free-standing replicated nanostructures, such as structures with a size smaller than 100 nm. In addition, a material with a modulus close to 0.1 GPa can achieve good pattern definition and obtain lines with sharp edges. As shown in FIG. 4, the modulus of the synthesized SSQ resins as measured by nanoindentation varies from about 0.5 GPa for PhAc20 (i.e., $T^{Ph}_{0.8}T^{MA}_{0.2}$) to about 4.5 GPa for PhEp80 (i.e., $T^{Ph}_{0.2}T^{Ep}_{0.8}$). These values are similar to those of common thermoplastics, such as PMMA (~2-3 GPa), and are high enough for high fidelity pattern replication of nano-scale structures while avoiding lateral collapsing of the imprinted lines that can occur upon mold releasing. As illustrated in FIG. 5, panel (a) depicts chemical structures of SSQ resins; panel (b) graphically illustrates the modulus of the UV cured SSQ resins measured by nanoindentation; and panels (c) and (d) show 350 nm and 20 nm line width grating structures, respectively.

According to the following equation, the throughput of the imprinting process depends on the viscosity of the polymeric precursor:

$$t_f = \frac{\eta_0 s^2}{2p}\left(\frac{1}{h_f^2} - \frac{1}{h_0^2}\right)$$

In this equation, $t_f$ is the imprinting time, p is the imprinting pressure, $\eta_0$ is the viscosity of the resist, $h_0$ and $h_f$ are the initial and the final resist thickness, respectively, and s is the distance the resist flows. A low viscosity is required to achieve the filling of the mold cavities within a few seconds using low pressure. The low viscosity of a liquid curable precursor is an advantage over the more viscous thermoplastic polymers, such as poly(methyl methacrylate) (PMMA) which has a reported viscosity of $4.6 \times 10^9$ Pa·s for a molecular weight of about $1.1 \times 10^5$ g mol$^{-1}$. For example, the time to imprint this PMMA is about 5 min by using about 100 bar.

Figure 6:
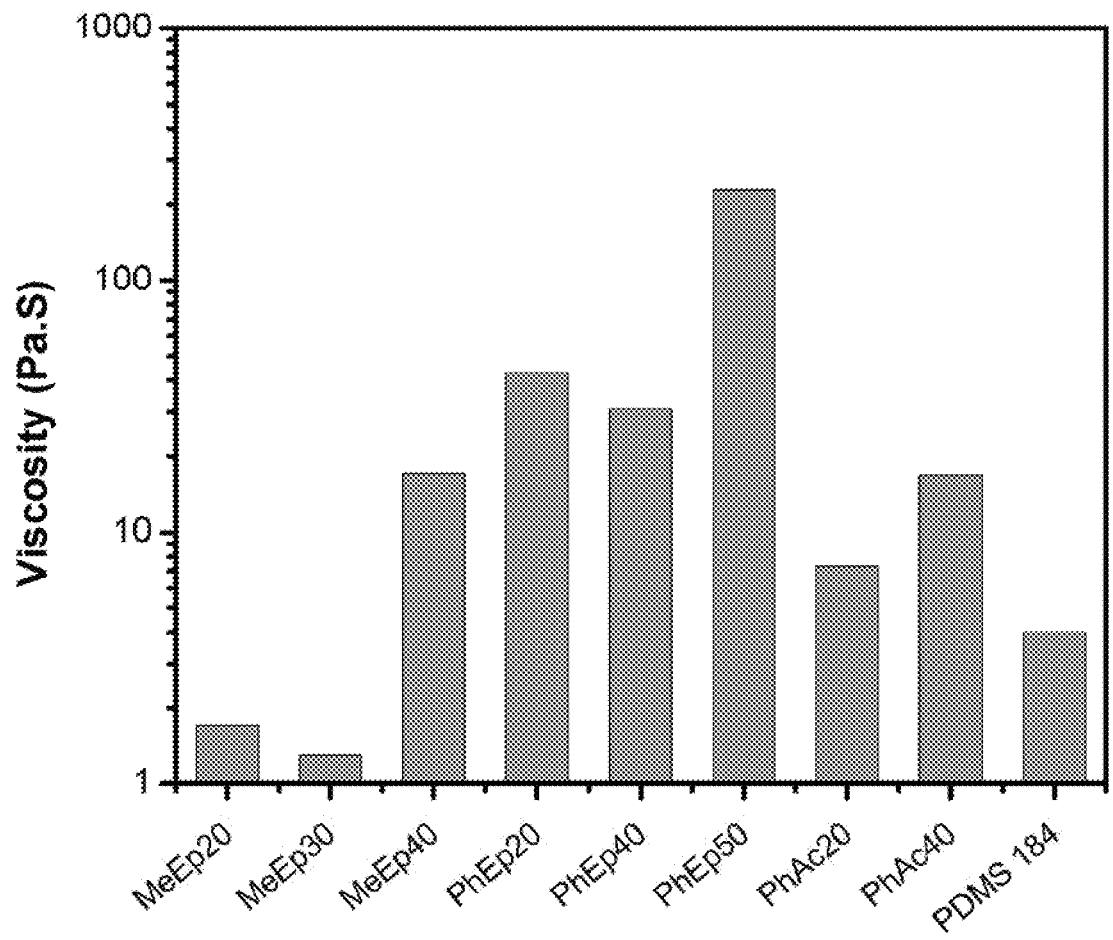
FIG. 6 illustrates the viscosity of SSQ resin examples.

Referring now to FIG. 6, the viscosity of the present SSQ resin examples, which vary from about 1 Pa·s to about a few hundred Pa·s, was much lower than the viscosities normally observed in thermoplastic polymers at high temperatures (e.g., several thousands of Pa·s). For this reason, and according to the above equation, only about a few seconds and low pressure are needed to imprint these resins. It was also found that the presence of the phenyl substituent increases the viscosity of the uncured resin.

Figure 7A:
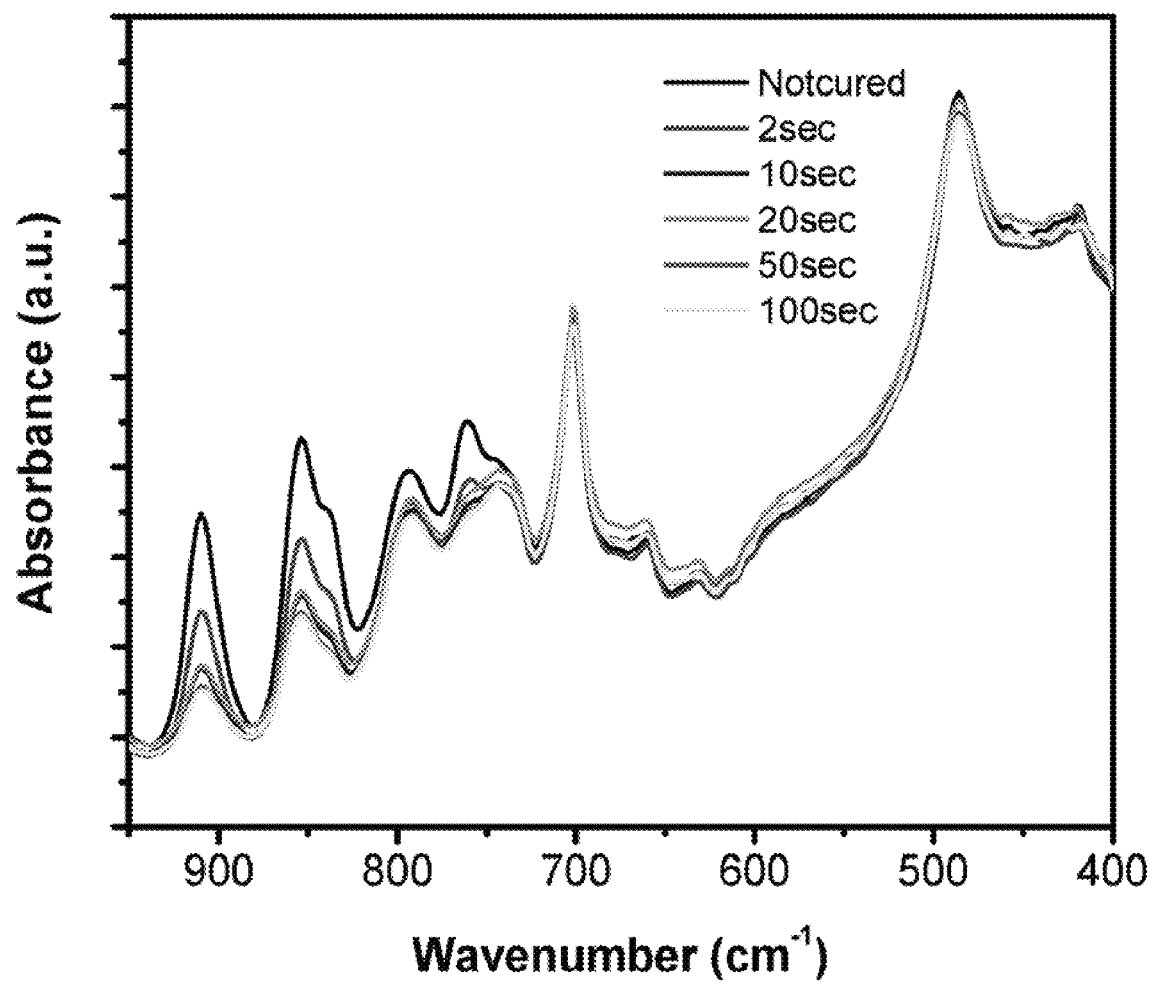
Figure 7B:
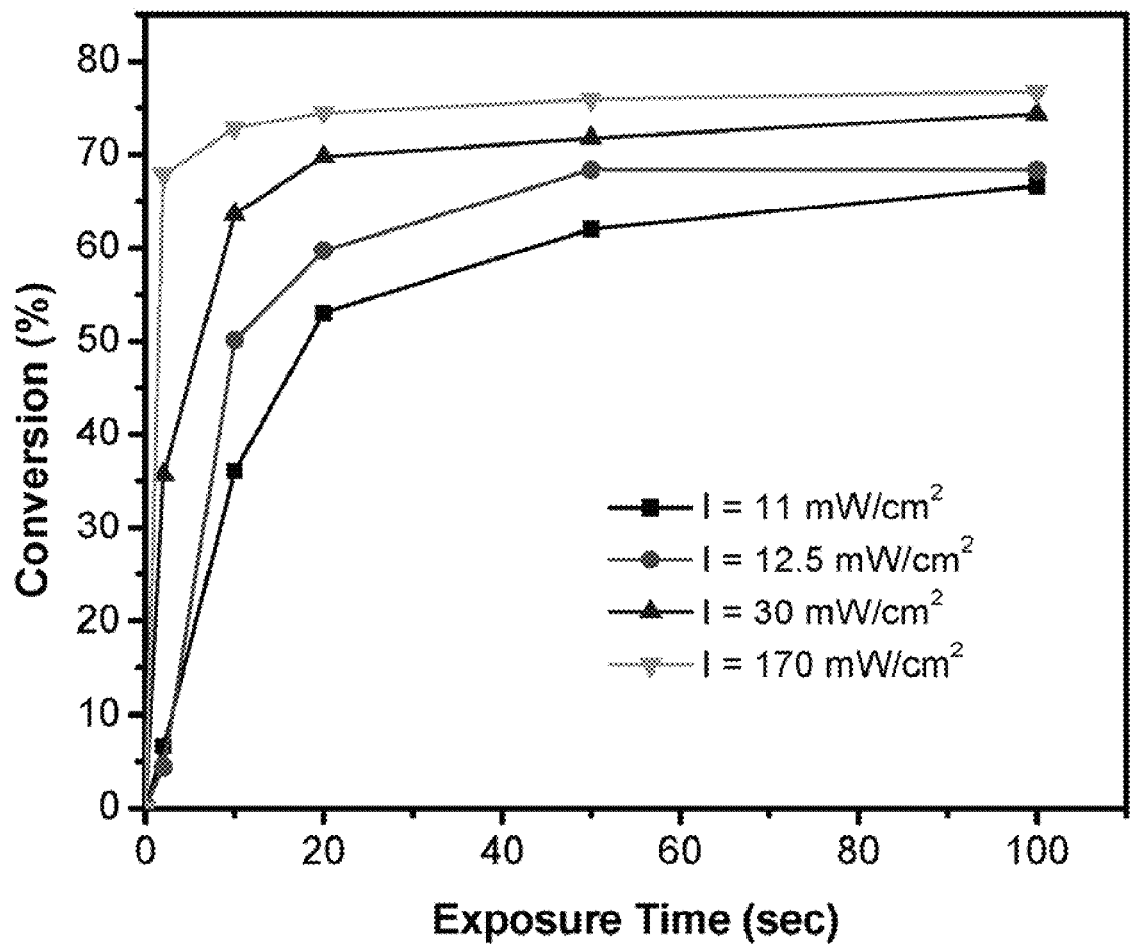
Figure 7C:
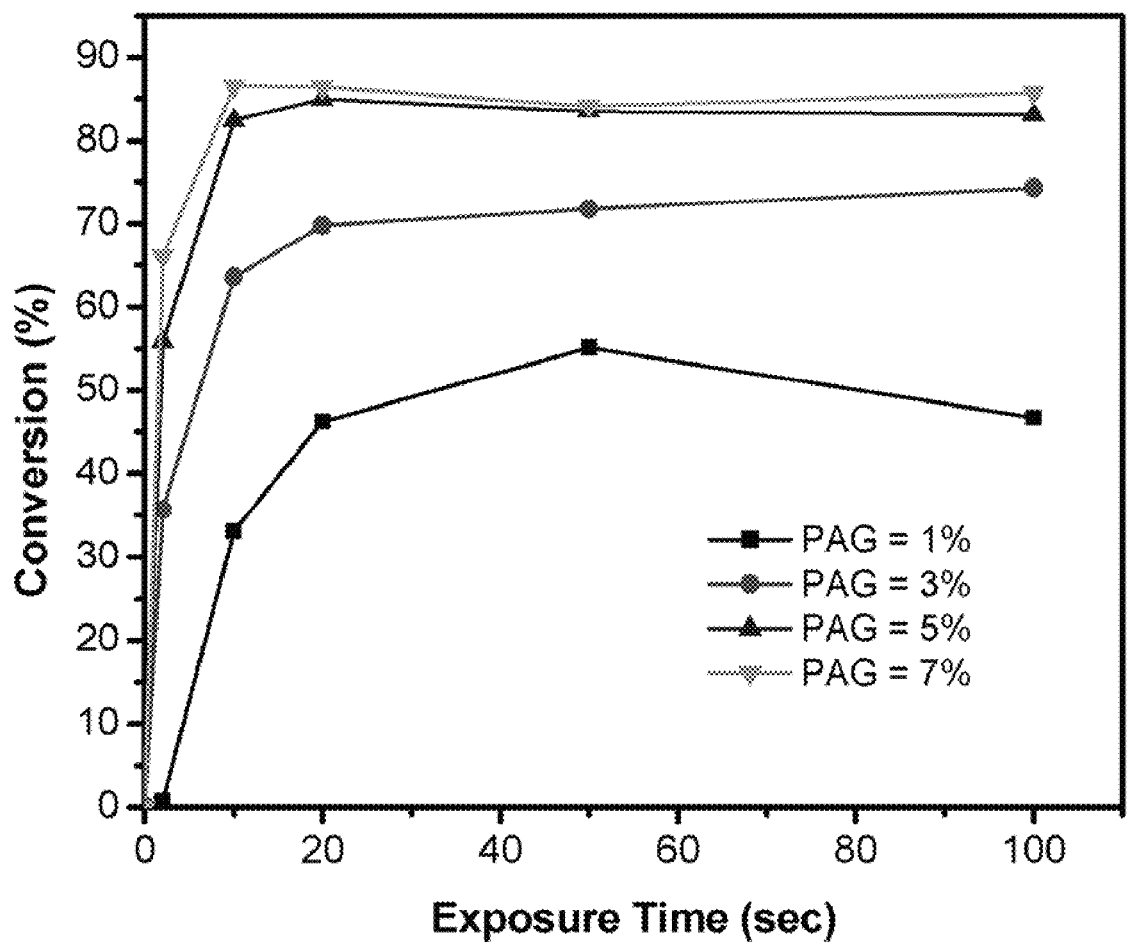

Curing of the resist material can be performed in a short period of time (e.g., a few seconds) to achieve a high throughput process for use in industrial applications of NIL. FTIR is used to characterize the resin crosslinking dynamics following UV light exposure under different conditions, as illustrated in FIG. 7(a). The epoxy based PhEp20 resin ($T^{Ph}_{0.8}T^{Ep}_{0.2}$, example 10) was exposed to various intensities of UV light to demonstrate that the degree of curing increases (conversion % of epoxy group) with the intensity of the irradiated UV light, as shown in FIG. 7(b). Higher light intensity can activate more epoxy groups at the beginning of the curing reaction, which can overcome the problem of low molecular mobility and diffusion normally induced during the network formation, leading to a higher degree of conversion. Light intensity also increases the curing rate. In addition, higher concentration of photoacid generator (PAG), such as UV9390C from Craig Adhesive and Coating Co. (Newark, N.J.) that contains 30-60% of bis(4-dodecylphenyl)iodonium hexafluoroantimonate, leads to a higher degree of crosslinking, as illustrated in FIG. 7(c). For example, curing as fast as about 2 seconds can be achieved under the appropriate conditions. Thus, the rate and degree of curing may be tailored by adjusting the UV light intensity and the amount of photoinitiator.

With reference to FIG. 7, panel (a) shows IR characterization of Ph-SSQ (epoxy based) material, with absorbance vs. wavenumber at different UV radiation intensities; panel (b) shows conversion vs. exposure time for different UV light intensities; and panel (c) shows the effect of the concentration of PAG on the degree of conversion.

Ideally, any shrinking caused by the UV light exposure during the curing process should be minimal to assure an accurate replication of the nanoscale features. The degree of shrinking measured for the SSQ resins is low, especially in the case of the epoxy based silsesquioxanes; e.g., less than about 6%. The lower levels of shrinking in the epoxy-based SSQ resins may be attributed to the conversion of the rigid oxirane ring into a more flexible open-chain segment in the cured material. In addition, the degree of shrinking of these SSQ resins appears to be proportional to the ratio of photoreactive sites; e.g., epoxy and/or acrylate groups.

Imprinted nanoscale structures can be exposed to high mechanical stresses during the mold releasing process. These demolding stresses may lead to breaking or deforming of the nano-scale features and structures if the resist does not provide an appropriate tensile strength. An advantage of silsesquioxane materials is that its chemical structure can be modified to obtain a material with the necessary tensile strength to withstand such high detrimental stresses. To illustrate, SSQ resins with phenyl and methyl groups were synthesized to investigate the effects of SSQ resin components in avoiding damage to the imprinted patterns upon mold release; e.g., SSQ resins illustrated in Table 1. SSQ resins containing methyl groups (i.e., $T^{Me}T^{Ep}$) displayed appropriate properties for sub-micron size replication; however, when smaller nano-sized structures were imprinted, some of the structures tend to deform and present some lateral collapsing. As illustrated in FIG. 8, better nanoscale patterns (70 nm line width) can be obtained with SSQ resin containing phenyl units (i.e., $T^{Ph}$-$T^{Ep}$), which provide enhanced tensile strength and greater toughness compared to the SSQ resin containing methyl units.

With reference now to FIG. 8, 70 nm line width nanostructures were replicated using SSQ resin with (a) methyl ($T^{Me}$-$T^{Ep}$) and (b) phenyl ($T^{Ph}T^{Ep}$). Also, 60 nm line width patterns were replicated using an SSQ resin with (c) a high ratio of epoxy groups $T^{Ph}_{0.2}T^{Ep}_{0.8}$ (example 10) and (d) $T^{Ph}_{0.5}T^{Ep}_{0.5}$ (example 9) with a lower amount of epoxy groups. Additional nanostructures were replicated with SSQ resin containing phenyl groups (e) $T^{Ph}_{0.5}T^{Ep}_{0.5}$ (example 9) and (f) $T^{Ph}_{0.5}T^{MA}_{0.5}$.

Other than the silane units having methyl and phenyl groups, the SSQ resins include silanes having radiation-curable functionalities that solidify the initially liquid-like resist through UV exposure to successfully achieve pattern transfer. The molar ratio of phenyl or methyl silane units to the silane having the crosslinking moiety can be tailored to achieve the desired mechanical properties. On one hand, a high amount of radiation-curable groups may lead to a material with poor mechanical properties for nanoimprinting. Structures replicated with the SSQ resin $T^{Ph}_{0.2}T^{Ep}_{0.8}$ (example 10), which contains a high molar ratio (about 80) of epoxy groups, may be more easily broken during the releasing process, resulting in a higher density of defects in the pattern, as illustrated in FIG. 8(c). On the other hand, reducing the content of crosslinking sites (in this example epoxy silane units) and increasing the amount of phenyl units can significantly diminish the breaking of the imprinted structures, as illustrated in FIG. 8(d). For example, a balance may be struck with SSQ resins synthesized with a molar ratio of a silane containing phenyl groups at about 0.40 to about 0.50 and a molar ratio of a silane containing crosslinking functionalities of about 0.50 to about 0.60, where these formulations provide good resists with few if any defects in the NIL process.

Short curing times (e.g., about a few seconds) allow the present compositions and methods to be used in a high throughput process amenable to industrial applications of NIL. The versatility of the present approach and synthesis of the present SSQ resins allows a variety of radiation-curable functionalities and combinations to be utilized. Fourier transform infrared spectroscopy (FTIR) can be used to characterize the synthesized silsesquioxane resin crosslinking dynamics following UV light exposure under different conditions. To illustrate, a SSQ resin with radiation-curable oxirane (epoxypropoxy) groups was synthesized using a cationic process to provide a curing model. In this case, crosslinking of the oxirane groups is not inhibited by oxygen, and therefore is not affected by atmospheric oxygen, and it is not necessary to perform the synthesis under an inert atmosphere. The degree of curing of the epoxy based SSQ resin increases with the intensity of the irradiated UV light, as illustrated in FIG. 7(b). Higher light intensity activates more epoxy groups at the beginning of the curing reaction, which can overcome the problems of low molecular mobility and diffusion that can occur during polymer network formation. The result is a higher degree of conversion. Light intensity also increases the curing rate and as shown in FIG. 7(c), higher concentration of photoacid generator (PAG) leads to a higher degree of crosslinking. Fast curing may also be achieved utilizing other silanes having UV-reactive groups, such as methacrylate or epoxycyclohexyl functional groups, in place of or in addition to the epoxypropoxy rings.

Radiation-curable groups, besides providing the mechanical integrity of the cured resin needed for the replication process, may further improve the adhesion between the resist and the substrate; a property required to achieve clean mold separation. For example, substrate adhesion may be enhanced by functionalizing the substrate with a chemical moiety that interacts with the radiation-curable moiety. In this fashion, the chemical moiety from the substrate and the radiation-curable moiety from the resist can react during the crosslinking step, for example, leading to strong resist-substrate adhesion. In addition, reactive silanol groups from the resin may also participate and interact with the substrate to provide high sticking of the resist to the substrate.

Resist adhesion to the mold may also be overcome by treating the mold with perfluorinated silanes to reduce its surface energy and produce defect-free patterns through an easy mold-resist separation. However, as the transferred features shrink in size to nano-scale dimensions, the contact area between the mold and resist increases dramatically, leading to stronger mold-resist adhesion. Mold separation may be facilitated therefore by reducing the surface energy of the resist. For this purpose, the present SSQ resins may be modified so that they contain fluoro ($CF_3$)-organic groups, such as perfluoroalkyl groups and perfluoro-ether groups in their chemical structure. The fluoro-organic groups can provide low surface energies due to the presence of —$CF_3$ groups. Although, it is important to note that the surface energy of the resist material should not be reduced to an extent where adhesion between the resist and the substrate becomes too weak so that the resist instead adheres to the mold.

To illustrate the tailoring of surface energy, SSQ resins bearing perfluoroalkyl groups, along with phenyl groups for mechanical stability and methacrylate moieties for crosslinking purposes were synthesized (examples 6-8 in Table 1). These materials exhibit a water contact angle of about 103° and about 115° at 2% and 10% molar ratio of perfluoroalkyl silanes, respectively (FIG. 9a). This is in contrast to the water contact angle of the material without perfluoroalkyl groups, which is about 72°. The resist containing 10% molar ratio of perfluoroalkyl silane ended up adhering to the mold instead of the substrate due to its low surface energy. On the other hand, the resist with 2% molar ratio of perfluoroalkyl silane presented outstanding releasing properties (low mold-resist adhesion) combined with a strong adhesion to the substrate and produced defect free patterns.

Another way to avoid low resist-substrate adhesion is to use a thin coupling layer of "adhesive" SSQ resin to enhance the bonding between fluorinated SSQ resin resist and the substrate. Such a coupling layer may include a higher amount of radiation-reactive groups that can chemically react with radiation-curable moieties present in the fluorinated SSQ resin resist. This coupling layer can be especially useful when very small nanostructures are replicated. As illustrated in FIG. 9, structures as small as 20 nm can be easily replicated using fluorinated SSQ in conjunction with an adhesive layer on the substrate. As another application, the fluorinated SSQ resist may itself be used as a mold for replicating a polymer mold and nanoimprinting other resist materials, as described in C. P.-Hernandez, P.-F. Fu, and L. J. Guo, "Easy duplication of stamps using UV-cured fluoro-silsesquioxane for nanoimprint lithography," J. Vac. Sci. & Technol. B. 26, 2426-2429 (2008).

Referring now to FIG. 9, panel (a) shows the structure of the low surface energy fluoro-SSQ resin, panel (b) shows a 20 nm pillar mold, panel (c) shows 20 nm pore structure replicated on fluoro-SSQ layer, and panel (d) provides a schematic of the strategy used to imprint the low surface energy fluoro-SSQ resin.

An important challenge in NIL for mass manufacturing is the fabrication of molds, also denoted as "stamps," for high-yield nanoscale replication. The fabrication of $SiO_2$ molds is a costly and time consuming process. In addition, $SiO_2$ is a brittle material and so the protruding nanostructures on a $SiO_2$ mold can be easily broken. Furthermore, due to its high rigidity, a $SiO_2$ mold cannot be used in applications where high flexibility is required such as roll to roll NIL. The fabrication of a $SiO_2$ mold is typically done by a combination of NIL and dry etching processes. An alternative to the $SiO_2$ is the use of more flexible, cheaper, and easier to process polymeric materials. Intermediate stamps have been previously fabricated by employing low surface energy polymers based on polysiloxanes as well as fluoropolymers by simple embossing or imprinting processes with original $SiO_2$ master molds. The low surface energy of such polymers not only eliminates the step of coating an antisticking layer on the stamp, but also leads to a clean separation of the master during the mold fabrication.

Poly-dimethysiloxane (PDMS), a thermoset elastomer, has been employed as a stamp for microcontact printing. But, the pattern fidelity of PDMS stamps is significantly affected after exposure to organic solvents. Perfluoropolyether (PFPE) based fluoropolymers were developed to overcome the limitations of PDMS materials. However, PFPE have a low modulus that is insufficient for the nanoscale replication of high aspect ratio structures. Other fluoropolymers, such as Teflon®, Dupont AF 2400, and ethylene(tetrafluroethylene) (ETFE) have also been used as stamps for nanoimprinting. Although they possess low surface energy for easy mold release, high temperatures and pressures are required for their replication from the original master.

Different coefficients of thermal expansion between such polymers and the original $SiO_2$ master mold make it difficult to maintain the critical dimension and lead to possible damage to the original master due to excessive thermal stress. In addition, an ETFE mold is not suitable for high temperature NIL applications due to a significant decrease in its modulus above 100° C. Nanoscale patterning has also been achieved with stamps fabricated using sol-gel materials, but a disadvantage of the sol-gel process is the difficulty in achieving accurate control and reproducibility of the final chemical structure and material properties.

The present SSQ resins provide good performing resists also due in part to their low-k properties. They may be directly patterned as dielectric materials. In addition, the present SSQ resins, including fluoro-SSQ resins such as $T^{Ph}T^{Flour}T^{MA}$, possess outstanding properties for applications as nanoimprint resist for nanoscale patterning. A medium viscosity SSQ resin can be easily imprinted and solidified by a brief UV-light exposure. The excellent mechanical properties, including high modulus and toughness, and the low surface energy characteristics of the present engineered fluoro-SSQ resins make them a suitable material for NIL molds/stamps. In addition, the mechanical properties of SSQ materials may be tailored to achieve high stiffness as well.

In some embodiments, the present fluoro-SSQ resins are used to duplicate $SiO_2$ master molds to make secondary molds for subsequent nanoimprint lithography processes. These SSQ-based secondary or intermediate molds replicated from the original master mold may find applications in high volume production processes using NIL, such as in bit-patterned magnetic disk manufacturing and roll to roll nanoimprint lithography. The low surface energy and the flexibility of the fluoro-SSQ materials allow easy replication from the master mold with faithful pattern transfer at room temperature and with low pressure. A multitude of flexible fluoro-SSQ molds can be easily duplicated from an original $SiO_2$ master, which helps to maintain an overall low defect density in the NIL process, while preserving the original master mold in its pristine state for high volume production.

Examples of the present SSQ resins were synthesized through hydrolytic condensation of trialkoxysilanes, $RSiX_3$. Fluoro-SSQ resin is a modification of the phenyl-SSQ or $T^{Ph}T^{MA}$ NIL resist, structure shown in FIG. 10(a), by adding the fluoro-functionality. The chemical structure of the synthesized fluoro-SSQ resin is shown in FIG. 10(b). The fluoroalkyl group imparts the low surface energy for the fluoro-SSQ. The phenyl groups help to toughen the material, and the methacrylic moieties will harden the initial viscous liquid into a solid material after UV photocuring. The fluoro-SSQ resin were synthesized via the co-hydrolysis of 3-(trimethoxysilyl)propyl methacrylate (MPTMS), phenyltrimethoxysilane (PTMS), and trimethoxy(3,3,4,4,5,5,6,6,7,7,8,8,8-tridecafluoro-1-octyl)silane in the presence of a basic catalyst.

In order to impart a fluoro-SSQ mold with good mechanical integrity, fluoro-SSQ resin prepolymer is applied on either a rigid or a flexible substrate, such as glass or polyethylene terephtalate (PET), respectively. But direct application of fluoro-SSQ resin to such substrates is not possible because fluoro-SSQ resins have low surface energy and therefore have poor adhesion to the substrate and also tend to stick to $SiO_2$ the master mold during the stamp fabrication process. In order to achieve good adhesion between the substrate and the fluoro-SSQ material and ease the separation of this material from the master during the releasing process, an intermediate layer of SSQ materials may be employed, as shown in FIG. 11, to fabricate the fluoro-SSQ stamp. This intermediate layer may be a higher surface energy $T^{Ph}T^{MA}$ precursor with methacrylate functionality that acts as an adhesive layer between the fluoro-SSQ resin and the substrate.

Referring now to FIG. 11, a process flow for improving adhesion between a PET substrate and fluoro-SSQ resin for fluoro-SSQ mold/stamp fabrication is shown.

To illustrate, a flexible PET substrate was first treated with $O_2$ plasma and surface functionalized with a self-assembled monolayer of methacrylate-silane that acts as an adhesion promoter between the substrate and the SSQ resin prepolymers. The silanization of PET is then performed at about 70° C. for about 30 min. Next, a 4% $T^{Ph}T^{MA}$ solution in propylene glycol monomethyl ether acetate (PGMEA) was spin coated on top of the surface treated PET substrate to form the intermediate adhesive layer. This layer was precured with UV light for about 20 sec under an air atmosphere. Following this, a 20% fluoro-SSQ resin solution in PGMEA was spun on top of the adhesive layer to form an active layer for mold replication that has a good release property.

To fabricate a fluoro-SSQ mold, an original SiO$_2$ master mold (coated with a fluorosilane monolayer) was placed on top of the fluoro-SSQ layer, as shown in FIG. 11(g), with slight pressure, and UV light was irradiated through the transparent glass or PET substrate for about 60 sec to cure the fluoro-SSQ resin. The UV curing was done under a nitrogen atmosphere to avoid oxygen inhibition of the free radical crosslinking. After UV curing, the SiO$_2$ master was released and the patterns were duplicated in the flexible fluoro-SSQ stamp. In addition, the replicated fluoro-SSQ stamp may be optionally exposed to a fluorosilane vapor at about 70° C. for about 50 min. The function of this optional step is to use the fluorosilane molecules to condense any residual, highly-reactive silanol groups in the SSQ resin, which may otherwise increase adhesion to subsequent resists when the fluro-SSQ stamp is used in subsequent NIL processes.

The fluoro-SSQ stamp was used to imprint PDMS materials and $T^{Ph}T^{Ep}$ (having the chemical structure shown in FIG. 10(c)) through thermal and photocuring processes, respectively. For thermal nanoimprinting, a PDMS resist was poured on top of a Si substrate and covered with the fluoro-SSQ stamp. This system was heated at about 70° C. for about 5 min to achieve thermal curing of the PDMS material. To imprint the $T^{Ph}T^{Ep}$ resin, a 20% solution of $T^{Ph}T^{Ep}$ in PGMEA solvent was spun on top of a silicon substrate. Then, the flexible fluoro-SSQ mold was placed on top, followed by UV exposure for about 60 sec.

The present fluoro-SSQ resins can provide low surface energies and have water contact angles up to about 108° or higher. These fluoro-SSQ resins prevent sufficient adhesion to the supporting substrates. As described, a monolayer of methacrylate-functional silane and a $T^{Ph}T^{MA}$ intermediate layer may be utilized to overcome this issue and to enhance the fluoro-SSQ-substrate adhesion. Similar to the fluoro-SSQ material and the surface treated substrate, the $T^{Ph}T^{MA}$ intermediate layer contains chemically compatible methacrylate groups to form a strong and continuous covalent network between the supporting substrate and the top fluoro-SSQ layer.

The $T^{Ph}T^{MA}$ employed to fabricate the intermediate layer may be a medium viscosity (about a few Pa·s) and can be precured with UV light to achieve enough mechanical integrity and avoid its removal while spin coating the fluoro-SSQ layer. Note that the intermediate layer may be only partially crosslinked during the precuring step to assure the presence of sufficient methacylate groups to form a strong network with the fluoro-SSQ layer during the subsequent curing step. As the modulus of the cured fluoro-SSQ resin (about 1 GPa) is sufficient for the replication of nanoscale size structures, and the viscosity of the polymeric precursor is about a few Pa·s, it is expected that the NIL resolution of the new fluoro-SSQ stamp will depend on the feature size on the original master mold. Scanning electron micrographs (SEMs) of the flexible fluoro-SSQ stamp are shown in FIG. 12, where 700 nm (panel (a)) and 220 nm (panel (b)) period patterns were easily replicated in fluoro-SSQ on top of a flexible PET substrate.

The SSQ resins can contain residual silanol groups (SiOH) following the synthesis procedure. These silanol groups remain present after the material is UV exposed. Residual silanol moieties may react with the resist material during the UV curing process, leading to strong stamp-to-resist adhesion. Therefore, an additional heat treatment step can be used to remove the residual silanol groups. Once the flexible fluoro-SSQ stamp was fabricated, it is surface treated by reacting with a fluorosilane vapor at about 70° C. for about 50 min. During this surface treatment, the residual silanol groups in the stamp surface are eliminated through a condensation reaction with the fluorosilane molecules.

The surface properties of the fluoro-SSQ resin, which may have a contact angle of about 108° or more, are suitable for high resolution nanopatterning. As a comparison, the water contact angles of PDMS and fluorosilane treated silicon were about 105° and 112°, respectively. The flexible fluoro-SSQ stamp was employed to imprint a PDMS resist and a $T^{Ph}T^{Ep}$ resist. The mold achieved clean separation from the resists and the 700 nm and 220 nm period dense grating patterns were successfully imprinted in both materials, as shown in FIG. 13. Change in the feature critical dimensions induced by the fluoro-SSQ stamp is about 5%, which corresponds to the percentage the synthesized SSQ resins shrink after UV exposure.

With reference to FIG. 13, SEM pictures of resist patterns imprinted by using the fluoro-SSQ based stamp are shown, where panel (a) depicts a 700 nm pitch PDMS grating, and panels (b) and (c) depict 700 nm and 220 nm pitch grating patterns in $T^{Ph}T^{Ep}$ resin, respectively.

The present examples demonstrate that low surface energy fluoro-SSQ resin may be used on a flexible PET substrate to allow duplication of a NIL master mold, such as a rigid SiO$_2$ mold. The subsequent fluoro-SSQ mold/stamp is flexible and may be used in high-throughput processes, both preserving the master mold and allowing operations that take advantage of having a flexible mold. An intermediate chemically compatible layer may be used to enhance the adhesion between the fluoro-SSQ material and the PET substrate. Fluoro-SSQ patterns can therefore be easily replicated with a clean release from the master mold with a high yield. The fabricated fluoro-SSQ stamps are useful for high volume nanoimprinting processes.

As illustrated, the present SSQ resins may be formulated to have liquid-like characteristics in their uncured state. These low viscosity formulations are easily imprinted with a 700 nm period and 120 nm line width SiO$_2$ mold, as shown in FIG. 14. The resulting cured resist (having a negative image of the mold) may then itself be used as a mold for imprinting resist. This second product consequently has the same features and pattern as the original SiO$_2$ mold. Quality of the pattern reproduction of the second product may be compared to the original SiO$_2$ mold, where an SEM picture of the original SiO$_2$ mold is shown in the fourth panel (far right) of FIG. 14.

The imprinting results demonstrate that the present SSQ resins are appropriate materials for nanoscale patterning. The high modulus of these SSQ resins allows the replication of nanofeatures with high fidelity and prevents lateral collapsing of the imprinted lines. Smaller feature size patterns include a 70 nm line width dense grating with an aspect ratio of 2.7:1, as shown in FIG. 15.

Since the present SSQ resins can be formulated to have high etch resistance, the patterned SSQ resist can advantageously be used directly as a "hard" mask in reactive ion etching of underlying substrate materials. FIG. 16 shows the 200 nm period grating structure etched into Si substrate by using an imprinted SSQ resist pattern as an etch mask.

The present SSQ resins may include at least one photo-initiator. The photo-initiator is any initiator that can be generated photo-chemically and induce the polymerization of the radiation-curable groups. The photo-initiator includes any photo-initiators known in the art, such as free radical photo-initiators, cationic photo-initiators, photobase generators, and so on. Many of these photo-initiators are known in the art and commercially available from companies such as Ciba Specialty Chemicals. Their structures and properties can be found in Schwalm, R. "UV coatings. Basics, Recent Developments and New Applications", Elsevier, Amsterdam, 2007; and J. V. Crivello, "The discovery and development of onium salt cationic photoinitiators", J. Polym. Sci. Part A: Polym. Chem. 1999, 37, 4241-4254.

In some embodiments, molds for use in the present processes may be prepared using methods and materials, as described in U.S. Pat. Appl. Pub. No. 2009/0046362 to Guo et al. and PCT Pub. No. WO/2008/124180, including other methods and materials used in the art. For example, a suitable mold may be prepared using ethylene tetrafluoroethylene (ETFE), which is a flexible and UV transparent copolymer. ETFE has a high melting point (260° C.), a modulus at RT of 0.35 GPa, and is mechanically stable for nanoscale replication.

Examples of substrates that may be coated with the present SSQ resins include silicon wafers and various polymers, including polyethylene terephthalate (PET), polyesters, polyethersulfone (PES), polycarbonate (PC), and similar materials. In some cases, the polymeric substrate may be flexible.

In some embodiments, the present SSQ resins may be used in resist lift-off methods. Lift-off is a process that includes removal of a material from a substrate, for example by solubilizing the material with a solvent, while leaving an insoluble material on the substrate. A diagrammatic illustration of an embodiment of a SSQ resin lift-off method is shown in FIG. 17. A substrate has a coating, such as PMMA, that is susceptible to being solubilized with a solvent. A radiation-curable SSQ resin is overlayed on the coating, imprinted using a mold, and at least partially cured using UV. The present SSQ resins, having low viscosity, allow the process to be carried out at room temperature (RT). A residual layer of the cured SSQ resin, located at the thinner portions of the imprinted resist layer, may then be removed to expose at least a portion of the underlying coating on the substrate. A portion of the coating is then removed in an undercutting step, to expose a portion of the underlying substrate, where the undercutting step may also take away a portion of the coating underneath the overlying SSQ resin. One or more new materials may then be deposited onto the portions of exposed substrate that are not protected by the remaining portions of coating and overlying SSQ resin. For example, the new material may include a deposited metal such as Ti, Ni, Cr, Au, etc. A solvent treatment dissolves and removes the remaining portion of the coating, lifting off the remaining SSQ resin from the substrate, and leaving the substrate patterned with the new material.

With reference to FIG. 18, SEM images show an original pattern formed on a coated substrate by NIL using an SSQ resin. The SSQ pattern is formed with a 700 nm period mold. In this embodiment, the SSQ resin employed is $T^{Ph}_{0.2}T^{Ph}_{0.8}$, 8% in PGMEA and the PMMA coating (underlayer) on the substrate is formed by coating the silicon substrate with PMMA 950K resist, or any other solvent-soluble polymers.

With reference to FIG. 19, SEM images show how residual SSQ resin located at the thinner portions of the SSQ resin pattern is removed. For example, reactive ion etching may be employed. In particular, a reactive ion etching (RIE) process using $CHF_3$ chemistry may be used for 2 min at 150 W, 20 scc and 20 mtorr to effect removal of SSQ resin and expose portions of the PMMA coating.

With reference to FIG. 20, SEM images show how portions of the PMMA coating are removed. For example, RIE using $O_2$ at 50 W, 20 sccm, and 20 mtorr, may be employed to expose the underlying substrate and undercut the overlying SSQ resin.

With reference to FIG. 21, SEM images show Cr deposited onto the substrate, where the remaining portions of PMMA coating and overlying SSQ resin have been lifted off by solubilizing the PMMA with acetone. The Cr pattern on the substrate corresponds to the initial mold pattern used to imprint the SSQ resin.

Several embodiments of the present UV-curable SSQ resins were synthesized and characterized by NMR to confirm the resultant chemical structures. Table 2 lists the identity of these SSQ resin compositions and FIGS. 22-29 depict representative NMR spectra. The following synthesis examples are included to demonstrate embodiments of the invention. It should be appreciated by those of skill in the art that the following examples represent techniques that function well in the practice of the technology, and may be considered to constitute preferred modes for its practice. However, those of skill in the art should, in light of the present disclosure, appreciate that many changes can be made in the specific embodiments which are disclosed and still obtain a like or similar result without departing from the spirit and scope of the technology. All listed percentages are in weight percent.

Example 1 from Table 1. Synthesis of poly(methyl-co-3-glycidoxypropyl)silsesquioxane, $T^{Me}_{0.2}T^{Ep}_{0.8}$.

To a 1 L 3-neck round-bottomed flask equipped with a mechanical stir shaft, a Dean-Stark trap with a condenser, and a nitrogen inlet and outlet were added 0.2 mol of methyltrimethoxysilane, 0.8 mol of 3-glycidoxypropyl trimethoxysilane, 180 g of toluene, 4 mol of water and 0.001 mol of base tetramethylammonium hydroxide. After the solution was refluxed at about 66° C. for 2 h while stirring, about 220 g of solvent was removed in about 1 h. The temperature was increased by further removing the solvent while adding equal amount of toluene to keep a constant resin concentration. The solution was then cooled to 50° C. and diluted with toluene. Then, the dilute solution was acidified with acetic acid and allowed to stir for about 15 min. The solution was washed with deionized water. The mixture was then transferred to a separation funnel and the lower water layer was discarded. After the upper layer was further washed with deionized water, the slightly cloudy solution was transferred to a pear flask and toluene was removed via a rotary evaporator. A colorless viscous liquid was obtained and kept for further characterization and evaluation.

Example 5 from Table 1. Synthesis of poly(phenyl-co-3-mathacryloxypropyl)silsesquioxane, $T^{Ph}_{0.4}T^{MA}_{0.6}$.

To a 1 L 3-neck round-bottomed flask equipped with a mechanical stir shaft, a Dean-Stark trap with a condenser, and a mixture of nitrogen/air inlet and outlet, was added 80 g of toluene, 0.60 mol of 3-methacryloxypropyltrimethoxysilane, 0.40 mol of phenyltrimethoxysilane, 2.40 mol of water, 1 g of CsOH aqueous solution (50 wt %). After the solution was refluxed for 1 h under stirring, part of the solvent was removed via the Dean Stark trap. After most of the methanol was removed, the solution became cloudy. Solvent was continuously removed and the solution became clear again when most of the water was removed through a Dean-Stark trap. The temperature was slowly raised to about 105° C. in about 1 h while methanol and water were being removed. This clear resin solution was cooled to 50° C. and diluted to about 15 wt % by adding toluene. The solution was acidified by adding acetic acid. It was stirred for 0.5 h. The solution was washed with deionized water. Then, the solution was filtered through a 1 micron filter paper. Toluene was removed through a rotary evaporator, and the solid resin was further dried under vacuum at ambient temperature overnight.

Example 8 from Table 1. Synthesis of poly(phenyl-co-3-glycidoxypropyl-co-1H,1H,2H,2H-perfluorooctyl)silsesquioxane, $TPh_{0.4}TEp_{0.5}TFluo_{0.1}$.

To a 1 L 3-neck round-bottomed flask equipped with a mechanical stir shaft, a Dean-Stark trap with a condenser, and a nitrogen inlet and outlet were added 0.4 mol of phenyltrimethoxysilane, 0.5 mol of 3-glycidoxypropyl trimethoxysilane, 0.1 mol of 1H,1H,2H,2H-perfluorooctyltriethoxysilane, 180 g of toluene, 4 mol of water and 0.001 mol of tetramethylammonium hydroxide. After the solution was refluxed for 2 h while stirring, part of the solvent was removed. The temperature was increased by further removing the solvent. The solution was then cooled to 50° C. and diluted with toluene. Then, the dilute solution was acidified with acetic acid and allowed to stir for about 15 min. The solution was washed with deionized water. The mixture was then transferred to a separation funnel and the lower water layer was discarded. After the upper layer was further washed with deionized water, the slightly cloudy solution was transferred to a pear flask and toluene was removed via a rotary evaporator. A colorless viscous liquid was obtained and kept for further characterization and evaluation.

Additional examples of the present compositions and methods include the following. Prior to nanoimprinting, a film is prepared as follows. A thin film of UV curable liquid is spin-coated on a substrate, such as silicon or glass. By varying the ratio of UV curable resin material to diluents, thin films having a thickness ranging from sub-100 nm to several microns may be achieved, as desired for a particular application requirement. Since the liquid resist spin-coated on the substrate has a low viscosity before curing, nanoimprinting the material only requires low pressure at room temperature. Various sizes of patterns have been achieved with the present UV-curable material system. Patterns as large as tens of microns and as small as 70 nanometers can be easily obtained, as shown in FIGS. 30 and 31.

With reference to FIG. 31, SEMs show nano-patterns created using an epoxy-based silsesquioxane resin ($T^{Ph}T^{Ep}$) resin with a cationic photo initiator (PAG). Panels (a) and (b) show a 70 nm line width pattern, panel (c) shows a 700 nm period pattern, and panel (d) shows 120 nm line width pattern.

With reference to FIG. 32, SEMs show nano-patterns created using a methacrylate-based silsesquioxane resin ($T^{Ph}T^{MA}$) resin with a free-radical photo initiator.

The present technology provides several benefits and advantages. The present systems and methods improve nanoimprint lithography (NIL) by allowing high-throughput replication of nanostructures with great precision. The present compositions and methods employ resist materials that are better suited for use as nanoimprint resists. The present resists include novel UV-curable silsesquioxane (SSQ) resins. These SSQ resins, for example containing phenyl and methyl substituents, possess a variety of characteristics desirable for NIL, such as a high modulus and excellent dry etch resistance. The presence of radiation-curable groups, such as acrylate or epoxy functional groups, allows the resists to be crosslinked via an UV-initiated free radical or cationic polymerization process. The chemical structure and degree of crosslinking of the present compositions can be tailored and free radical or cationic crosslinking can be selected according to requirements. The present compositions and method are amenable to high-throughput and high resolution nanopatterning and may be employed in diverse applications and fields such as electronics, photonics, biotechnology, and data storage.

The embodiments and the examples described herein are exemplary and not intended to be limiting in describing the full scope of apparatus, systems, and methods of the present technology. Equivalent changes, modifications and variations of some embodiments, materials, compositions and methods can be made within the scope of the present technology, with substantially similar results.

The invention claimed is:

1. A stamp or mold for nanoimprint lithography comprising a cured organosiloxane resin that defines a feature having at least one dimension of greater than or equal to about 2 nanometers to less than or equal to about 100 micrometers for nanoimprint lithography, wherein the organosiloxane resin is a reaction product formed in the presence of a basic catalyst that comprises at least one silsesquioxane unit of formula (II):

$$—(R^2SiO_{1.5})— \quad (II)$$

wherein $R^2$ is at least one radiation-curable group independently selected from the group consisting of acrylate, epoxy, and vinyl ether groups;
a second unit selected from:
$—(R^5SiO_{1.5})—$ or $—(R^1R^5SiO)—$, wherein $R^5$ is a C1-C12 linear or branched alkyl group including at least one halogen heteroatom; and
at least one additional unit selected from:

$$—(R^1SiO_{1.5})—; \text{ or} \quad (I)$$

$$—(SiO_2)—; \quad (IV)$$

wherein $R^1$ is independently selected from the group consisting of hydrogen; C1-C12 linear or branched alkyl groups; C1-C12 linear or branched alkyl groups including at least one heteroatom selected from the group consisting of nitrogen, oxygen, and combinations thereof; C1-C12 linear or branched carboxylate groups; C1-C12 linear or branched ether groups; and C6-C12 aryl groups, including phenyl groups.

2. The stamp or mold of claim 1, wherein the radiation-curable group is curable with actinic radiation, or both thermal and actinic radiation.

3. The stamp or mold of claim 1, wherein the organosiloxane resin comprises at least one di-functional (D) unit of formula (III) derived from a difunctional silane, $R^3R^4SiX_2$, wherein X is a halide, alkoxyl, or acetoxy group:

$$—(R^3R^4SiO)— \quad (III)$$

wherein:
$R^3$ and $R^4$ are independently selected from the group consisting of hydrogen; C1-C12 linear or branched alkyl groups; C1-C12 linear or branched alkyl groups including at least one heteroatom selected from the group consisting of nitrogen, oxygen, halogen, and combinations thereof; C1-C12 linear or branched carboxylate groups; C1-C12 linear or branched ether groups; C6-C12 aryl groups, including phenyl groups; and fluoro-containing organic groups, including fluoro-alkyl groups and fluoro-ether groups; and a radiation-curable group selected from the group consisting of acrylate, epoxy, and vinyl ether groups.

4. The stamp or mold of claim 1, wherein the organosiloxane resin comprises at least one quadri-functional (Q) unit of formula (IV) derived from $SiX_4$ monomer, wherein X is a halide, alkoxyl, or acetoxy group: (IV) $—(SiO_2)—$.

5. The stamp or mold of claim 1, wherein the organosiloxane resin comprises one of the following formulas:

$$[R^1SiO_{3/2}]_m[R^2SiO_{3/2}]_n[R^1R^5SiO]_p(T^{R1}T^{R2}D^{R1,R5}, m+n+p=1);$$

$$[R^1SiO_{3/2}]_m[R^2SiO_{3/2}]_n[R^1R^5SiO]_p[SiO_2]_q (T^{R1}T^{R2}D^{R1,R5}Q, m+n+p+q=1);$$

$$[R^2SiO_{3/2}]_n[R^1R^5SiO]_p[SiO_2]_q(T^{R2}D^{R1,R5}Q, n+p+q=1);$$

$$[R^2SiO_{3/2}]_n[R^5SiO_{3/2}]_o[SiO_2]_q(T^{R2}T^{R5}Q, n+o+q=1);$$

$$[R^1SiO_{3/2}]_m[R^2SiO_{3/2}]_n[R^5SiO_{3/2}]_o(T^{R1}T^{R2}T^{R5}, m+n+o=1);$$

wherein:
$R^1$, $R^2$, and $R^5$ are as defined in claim 1,
m is the molar ratio of $[R^1SiO_{3/2}]$ unit;
n is the molar ratio of $[R^2SiO_{3/2}]$ unit;
p is the molar ratio of $[R^1R^5SiO]$ unit;
q is the molar ratio of $[SiO_2]$ unit; and
o is the molar ratio of $[R^5SiO_{3/2}]$ unit;
with the proviso that the sum of the molar ratios of all components in each formula is equal to 1.

6. The stamp or mold of claim 1, wherein the organosiloxane resin comprises one of the following formulas:

$$[R^1SiO_{3/2}]_m[R^2SiO_{3/2}]_n[R^1R^5SiO]_p(T^{R1}T^{R2}D^{R1,R5}, m+n+p=1);$$

$$[R^1SiO_{3/2}]_m[R^2SiO_{3/2}]_n[R^5SiO_{3/2}]_o(T^{R1}T^{R2}T^{R5}, m+n+o=1);$$

wherein:
$R^1$, $R^2$, and $R^5$ are as defined in claim 1,
m is the molar ratio of $[R^1SiO_{3/2}]$ unit;
n is the molar ratio of $[R^2SiO_{3/2}]$ unit;
p is the molar ratio of $[R^1R^5SiO]$ unit; and
o is the molar ratio of $[R^5SiO_{3/2}]$ unit;
with the proviso that the sum of molar ratios of all components in each formula is equal to 1.

7. The stamp or mold of claim 1, wherein the cured organosiloxane resin comprises a fluoro-containing organic group, fluoro-alkyl group, or fluoro-ether group.

8. The stamp or mold of claim 1, wherein the cured organosiloxane resin has a modulus of about 0.5 GPa to about 4.5 GPa.

9. The stamp or mold of claim 1, wherein the organosiloxane resin is made by hydrolysis of at least one of the following units: $R^1SiX_3$, $R^2SiX_3$, $R^3R^4SiX_2$, $R^5SiX_3$, or combinations thereof in the presence of a basic catalyst, wherein X is a halide, an alkoxy group, or an acetoxy group.

10. The stamp or mold of claim 1, wherein the basic catalyst is selected from the group consisting of: tetramethylammonium hydroxide (TMAH) or cesium hydroxide (CsOH).

11. The stamp or mold of claim 1, wherein the organosiloxane resin has been heat-treated and reacted with a silane compound to remove residual silanol groups.

12. The stamp or mold of claim 11, wherein $R^2$ is a radiation-curable group independently selected from the group consisting of epoxy and vinyl ether groups.

13. The stamp or mold of claim 1, wherein the cured organosiloxane resin has a molecular weight of about 1,000 g/mol to about 6,000 g/mol.

14. The stamp or mold of claim 1, wherein the cured organosiloxane resin has a shrinkage rate of less than or equal to about 6% as compared to the organosiloxane resin prior to curing.

15. A stamp or mold for nanoimprint lithography comprising a cured organosiloxane resin that defines a feature having at least one dimension of greater than or equal to about 2 nanometers to less than or equal to about 100 micrometers for nanoimprint lithography, wherein the organosiloxane resin is a reaction product formed in the presence of a basic catalyst that comprises at least one silsesquioxane unit of formula (II):

$$—(R^2SiO_{1.5})— \quad (II)$$

wherein $R^2$ is at least one radiation-curable group independently selected from the group consisting of acrylate, epoxy, and vinyl ether groups;
a second unit selected from:
—$(R^5SiO_{1.5})$— or —$(R^1R^5SiO)$—, wherein $R^5$ is a C1-C12 linear or branched alkyl group including at least one fluorine heteroatom; and
at least one additional unit selected from:

$$—(R^1SiO_{1.5})—; \text{ or} \quad (I)$$

$$—(SiO_2)—; \quad (IV)$$

wherein $R^1$ is independently selected from the group consisting of hydrogen; C1-C12 linear or branched alkyl groups; C1-C12 linear or branched alkyl groups including at least one heteroatom selected from the group consisting of nitrogen, oxygen, and combinations thereof; C1-C12 linear or branched carboxylate groups; C1-C12 linear or branched ether groups; and C6-C12 aryl groups, including phenyl groups.

16. The stamp or mold of claim 15, wherein the cured organosiloxane resin has a molecular weight of about 1,000 g/mol to about 6,000 g/mol and the cured organosiloxane resin has a shrinkage rate of less than or equal to about 6% as compared to the organosiloxane resin prior to curing.

17. A nano-patterned article formed from nanoimprint lithography comprising a patterned surface defining at least one mechanically imprinted feature having at least one dimension of greater than or equal to about 2 nanometers to less than or equal to about 100 micrometers, wherein the nano-patterned article comprises a cured organosiloxane resin that is a reaction product formed in the presence of a basic catalyst that comprises at least one silsesquioxane unit of formula (II):

$$—(R^2SiO_{1.5})— \quad (II)$$

wherein $R^2$ is at least one radiation-curable group independently selected from the group consisting of acrylate, epoxy, and vinyl ether groups;
a second unit selected from:
—$(R^5SiO_{1.5})$— or —$(R^1R^5SiO)$—, wherein $R^5$ is a C1-C12 linear or branched alkyl group including at least one fluorine heteroatom; and
at least one additional unit selected from:

$$—(R^1SiO_{1.5})—; \text{ or} \quad (I)$$

$$—(SiO_2)—; \quad (IV)$$

wherein $R^1$ is independently selected from the group consisting of hydrogen; C1-C12 linear or branched alkyl groups; C1-C12 linear or branched alkyl groups including at least one heteroatom selected from the group consisting of nitrogen, oxygen, and combinations thereof; C1-C12 linear or branched carboxylate groups; C1-C12 linear or branched ether groups; and C6-C12 aryl groups, including phenyl groups.

18. The nano-patterned article of claim 17, wherein the cured organosiloxane resin has a molecular weight of about 1,000 g/mol to about 6,000 g/mol and the cured organosiloxane resin has a shrinkage rate of less than or equal to about 6% as compared to the organosiloxane resin prior to curing.

* * * * *

UNITED STATES PATENT AND TRADEMARK OFFICE
CERTIFICATE OF CORRECTION

PATENT NO. : 8,293,354 B2
APPLICATION NO. : 12/421333
DATED : October 23, 2012
INVENTOR(S) : Peng-Fei Fu and Lingjie Jay Guo It is certified that error appears in the above-identified patent and that said Letters Patent is hereby corrected as shown below:

Title Page, No. (54), Title, and Column 1, Lines 1-2, title should be: --UV CURABLE SILSESQUIOXANE RESINS FOR NANOIMPRINT LITHOGRAPHY--.

Column 2, Line 46, "silsequioxane" should be --silsesquioxane--.

Column 2, Line 60, "silsequioxane" should be --silsesquioxane--.

Column 5, Line 45, "$T_{(06}$" should be --$T_{06}$--.

Column 7, Line 52, after "used" delete "to".

Column 12, Line 14, after "due" insert --to--.

Column 12, Line 33, "$T^{Me}y$" should be --$T^{Me}_y$--.

Column 17, Line 65, "$T^{Flour}$" should be --$T^{Fluor}$--.

Column 19, Line 17, "fluro-SSQ" should be --fluoro-SSQ--.

Column 19, Line 32, "highter" should be --higher--.

Signed and Sealed this
Nineteenth Day of March, 2013

Teresa Stanek Rea
*Acting Director of the United States Patent and Trademark Office*